United States Patent
Jeon

(10) Patent No.: US 11,094,760 B2
(45) Date of Patent: Aug. 17, 2021

(54) METHOD FOR FORMING LIGHT EMITTING ELEMENT PATTERN AND DISPLAY DEVICE USING THE SAME

(71) Applicant: Samsung Display Co., Ltd., Yongin-Si (KR)

(72) Inventor: Woo-Seok Jeon, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/536,104

(22) Filed: Aug. 8, 2019

(65) Prior Publication Data
US 2020/0161394 A1 May 21, 2020

(30) Foreign Application Priority Data
Nov. 19, 2018 (KR) .................... 10-2018-0142743

(51) Int. Cl.
| H01L 27/32 | (2006.01) |
| H01L 51/00 | (2006.01) |
| H01L 51/56 | (2006.01) |
| H01L 51/52 | (2006.01) |

(52) U.S. Cl.
CPC ...... *H01L 27/3246* (2013.01); *H01L 51/0018* (2013.01); *H01L 51/5253* (2013.01); *H01L 51/56* (2013.01)

(58) Field of Classification Search
CPC . H01L 27/3246; H01L 51/0018; H01L 51/56; H01L 51/5253; H01L 51/0011
See application file for complete search history.

(56) References Cited

U.S. PATENT DOCUMENTS

| 5,185,278 A * | 2/1993 | Barker ............... H01L 29/66863 257/E21.452 |
| 6,013,538 A * | 1/2000 | Burrows ................ H01L 27/32 257/40 |
| 6,051,485 A * | 4/2000 | Schindler ................ H01L 28/60 438/577 |
| 9,899,636 B2 * | 2/2018 | Defranco ............ H01L 27/3218 |
| 2005/0136648 A1 * | 6/2005 | Sharma ................ H01L 43/12 438/637 |
| 2014/0127625 A1 | 5/2014 | Defranco et al. |
| 2015/0311084 A1 * | 10/2015 | Moore .............. H01L 29/66462 257/280 |
| 2016/0247863 A1 * | 8/2016 | Choung ............. H01L 27/3211 |

FOREIGN PATENT DOCUMENTS

JP 3302262 B2 7/2002

* cited by examiner

*Primary Examiner* — Syed I Gheyas
(74) *Attorney, Agent, or Firm* — Innovation Counsel LLP

(57) ABSTRACT

A method for forming a light emitting element pattern according to an embodiment of the inventive concept includes forming a pattern layer having an opening on a target material, forming a light emitting element pattern on the target material in correspondence to the opening, and removing the pattern layer. Here, the pattern layer includes a first pattern layer disposed on the target material, a second pattern layer disposed on the first pattern layer, and a third pattern layer disposed on the second pattern layer. The second pattern layer has an undercut portion recessed from edges of the third pattern layer.

18 Claims, 20 Drawing Sheets

METHOD FOR FORMING LIGHT EMITTING ELEMENT PATTERN AND DISPLAY DEVICE USING THE SAME

CROSS-REFERENCE TO RELATED APPLICATIONS

This U.S. non-provisional patent application claims priority under 35 U.S.C. § 119 to Korean Patent Application No. 10-2018-0142743, filed on Nov. 19, 2018, the entire contents of which are hereby incorporated by reference.

BACKGROUND

The present disclosure herein relates to a method for forming a light emitting element pattern and a display device using the same, and more particularly, to a method for forming a light emitting element pattern, which improves in process reliability, and a display device using the same.

When a display device is manufactured, at least a portion of layers or patterns of the display device may be formed by using a photolithography process. The photolithography process may include exposure, developing, and etching processes. In particular, the photolithography process may be used to form a light emitting layer.

A photoresist pattern for forming the light emitting layer is formed, then the light emitting layer is formed on a corresponding pixel area using the photoresist pattern, and then the photoresist pattern is removed through a lift-off process. However, since the lift-off process is performed while being exposed to the atmosphere, a protection layer for protecting the light emitting layer from oxygen and moisture in the atmosphere is necessary.

SUMMARY

The present disclosure provides a method for forming a light emitting element pattern, which improves in process reliability, and a display device using the same.

An embodiment of the inventive concept provides a method for forming a light emitting element pattern, the method including: forming a pattern layer having an opening on a target material; forming a light emitting element pattern on the target material in correspondence to the opening; and removing the pattern layer. The pattern layer includes: a first pattern layer disposed on the target material; a second pattern layer disposed on the first pattern layer; and a third pattern layer disposed on the second pattern layer. The second pattern layer has an undercut portion recessed from edges of the third pattern layer to define an inner opening between the first and third pattern layers.

In an embodiment, the forming of the pattern layer may include: forming a first layer on the target material; forming a second layer on the first layer; forming a third layer on the second layer; forming the third pattern layer by patterning the third layer; forming the second pattern layer by patterning the second layer; and forming the first pattern layer by patterning the first layer.

In an embodiment, the forming of the third pattern layer may include: exposing the third layer; and forming the third pattern layer having a first opening corresponding to the opening by developing an exposed portion of the third layer.

In an embodiment, the forming of the second pattern layer may include forming the second pattern layer having the inner opening by etching the second layer using the third pattern layer as a mask.

In an embodiment, the second layer may be etched using an isotropic etching method.

In an embodiment, the forming of the first pattern layer may include etching the first layer using the third pattern layer as a mask.

In an embodiment, the first layer may be etched using an anisotropic etching method.

In an embodiment, the forming of the pattern layer may include: forming the first layer on the target material; forming the second layer on the first layer; forming the third layer on the second layer; forming the third pattern layer by patterning the third layer; forming a preliminary pattern layer by patterning the second layer; forming the first pattern layer by patterning the first layer; and forming the second pattern layer by etching the preliminary pattern layer.

In an embodiment, the forming of the third pattern layer may include: exposing the third layer; and forming the third pattern layer having a first opening corresponding to the opening by developing an exposed portion of the third layer.

In an embodiment, the forming of the preliminary pattern layer may include forming the preliminary pattern layer by etching the second layer using the third pattern layer as a mask.

In an embodiment, the second layer may be etched using an anisotropic etching method.

In an embodiment, the forming of the first pattern layer may include etching the first layer using the third pattern layer and the preliminary pattern layer as a mask.

In an embodiment, the first layer may be etched using an anisotropic etching method.

In an embodiment, the second pattern layer in which the inner opening is provided may be formed by etching the preliminary pattern layer using an isotropic etching method.

In an embodiment, the second pattern layer may include a metallic material or an inorganic material.

In an embodiment, the second pattern layer may have a thickness of several hundreds A to several thousands A.

In an embodiment, the target material may include: a base layer; and a pixel defining pattern configured to define a pixel area on the base layer.

In an embodiment, the light emitting element pattern may include: a light emitting layer; an electrode layer disposed on the light emitting layer; and a protection layer configured to cover the electrode layer.

In an embodiment, the protection layer may include an inorganic material.

In an embodiment, a method for forming a light emitting element pattern includes: forming a first pattern layer having an opening on a target material; forming a light emitting element pattern layer in an area corresponding to the opening and a dummy pattern layer configured to cover a top surface of the first pattern layer on the target material; forming a preliminary protection layer configured to cover the dummy pattern layer, a sidewall of the first pattern layer, and the light emitting element pattern layer; forming a second pattern layer on the preliminary protection layer in the area corresponding to the opening; forming a protection layer by removing the preliminary protection layer on the dummy pattern layer and the dummy pattern layer using the second pattern layer as a mask; and removing the first and second pattern layers.

In an embodiment, the forming of the first pattern layer may include: forming a first layer on the target material; forming a second layer on the first layer; forming a second sub-pattern layer by patterning the second layer; and forming a first sub-pattern layer by patterning the first layer.

In an embodiment, the removing of the first and second pattern layers may include: removing the second pattern layer and the second sub-pattern layer through a strip process; and removing the first sub-pattern layer through a developing or etching process.

In an embodiment, the forming of the light emitting element pattern layer and the dummy pattern layer may include: forming a light emitting layer on the target material; and forming an electrode layer on the light emitting layer.

In an embodiment, the protection layer may include: a cover portion configured to cover the electrode layer; a protruding portion extending from the cover portion and protruding in a thickness direction of the cover portion; and an extension portion extending from the protruding portion in parallel to the cover portion.

In an embodiment, the target material may include: a base layer; and a pixel defining pattern configured to define a pixel area on the base layer.

In an embodiment, a display device includes: a base layer; a pixel defining pattern configured to define pixel areas and disposed on the base layer; and a light emitting element pattern disposed on each of the pixel areas. The light emitting element pattern includes: a light emitting layer; an electrode layer disposed on the light emitting layer; and a protection layer configured to cover the electrode layer. The protection layer includes: a cover portion disposed to overlap the electrode layer; and a protruding portion extending from the cover portion and protruding in a thickness direction of the cover portion.

The protection layer may further include an extension portion connected to an end of the protruding portion and extending substantially parallel to the base layer.

The extension portion may extend toward the electrode layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
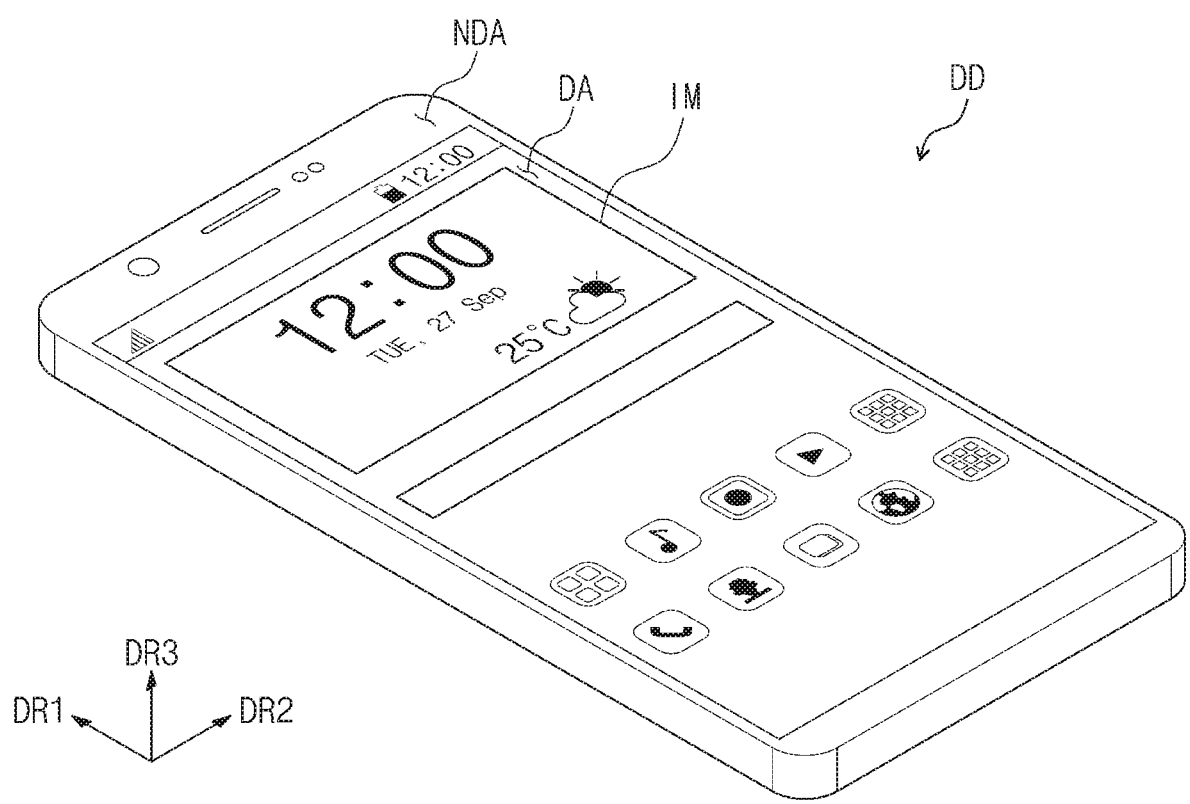
FIG. 1 is a perspective view illustrating a display device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

FIG. 1 is a perspective view illustrating a display device according to an embodiment of the inventive concept.

Referring to FIG. 1, a display area DA and a non-display area NDA may be defined on a display device DD.

The display area DA on which an image IM is displayed is parallel to a plane defined by a first directional axis DR1 and a second directional axis DR2. A normal direction of the display area DA, i.e., a thickness direction of the display device DD, is indicated by a third directional axis DR3. A front surface (or top surface) and a rear surface (or bottom surface) of each constituents are distinguished by the third directional axis DR3. However, directions indicated by the first to third directional axes DR1, DR2, and DR3 may be a relative concept, and thus altered each other. Hereinafter, first to third directions may be directions indicated by the first to third directional axes DR1, DR2, and DR3, and designated by the same reference numerals, respectively.

The display device DD may be used for large-sized electronic devices such as televisions, monitors, or outdoor advertisement boards and small and medium-sized electronic devices such as personal computers, notebook computers, personal digital terminals, navigation units for vehicles, game consoles, portable electronic devices, and cameras. The above-described devices are exemplified as merely an exemplary embodiment, and thus, the display device DD may be adopted for other electronic devices unless departing from the spirit and scope of the invention.

The non-display area NDA is an area which is adjacent to the display area DA and on which the image IM is not displayed. The non-display area NDA may define a bezel area of the display device DD.

The non-display area NDA may surround the display area DA. However, the embodiment of the inventive concept is not limited thereto. For example, the non-display area NDA may be adjacent to only a portion of an edge of the display area DA.

Figure 2:
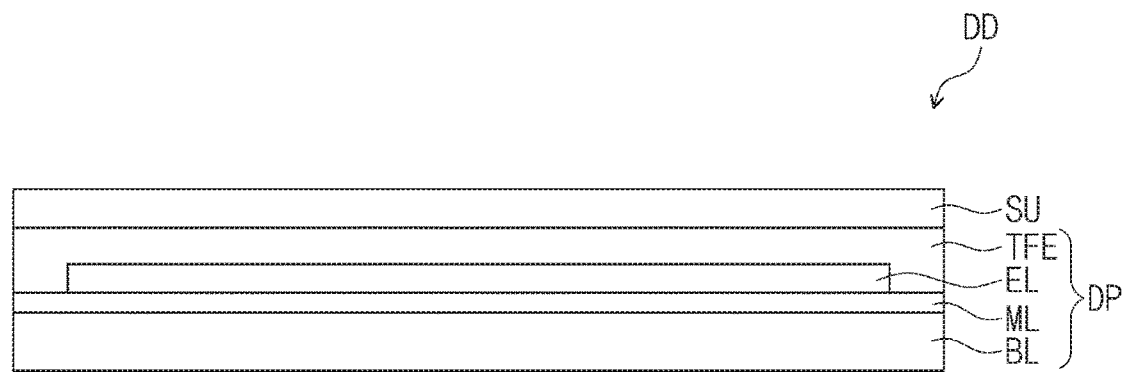
FIG. 2 is a cross-sectional view illustrating the display device according to an embodiment of the inventive concept.
Figure 2:
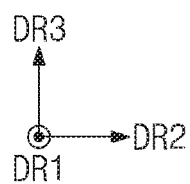

FIG. 2 is a cross-sectional view illustrating the display device DD according to an embodiment of the inventive concept.

Referring to FIG. 2, the display device DD may include a display panel DP and a sensor SU.

The display panel DP may include a base layer BL, a circuit layer ML, a light emitting element layer EL, and a thin-film encapsulation layer TFE. Although an organic light emitting display panel is described as an example of the display panel DP in this specification, the embodiment of the inventive concept is not limited thereto.

The base layer BL may be a laminated structure including a silicon substrate, a plastic substrate, a glass substrate, an insulating film, or a plurality of insulation layers.

The circuit layer ML may be disposed on the base layer BL. The circuit layer ML may include a plurality of insulation layers, a plurality of conductive layers, and a semiconductor layer.

The light emitting element layer EL may be disposed on the circuit layer ML. The light emitting element layer EL may include, e.g., organic light emitting diodes. However, the embodiment of the inventive concept is not limited thereto. For example, the light emitting element layer EL may include inorganic light emitting diodes or organic-inorganic hybrid light emitting diodes according to a kind of display panel DP.

The thin-film encapsulation layer TFE seals the light emitting element layer EL. The thin-film encapsulation layer TFE may include a plurality of inorganic layers and at least one organic layer disposed between the plurality of inorganic layers. Also, the thin-film encapsulation layer TFE may further include a buffer layer. The buffer layer may be a layer disposed closest to the sensor SU. The buffer layer may be an inorganic layer or an organic layer.

The sensor SU may include a circuit for detecting a touch. A touch detecting method of the sensor SU includes a resistive layer method, an optical method, a capacitive method, and an ultrasonic method. However, the embodiment of the inventive concept is not limited thereto. Among the above-described methods, when sensor SU employs the capacitive method, the sensor SU may detect whether a touch is generated by using capacitance that is varied when a touch generation unit touches a screen of the display device DD. The capacitive method may be classified into a mutual capacitive method and a self capacitive method.

The sensor SU may be directly disposed on the display panel DP. The expression of "directly disposed" represents that the sensor SU is formed directly on the display panel DP without using a separate adhesive member. However, the embodiment of the inventive concept is not limited thereto. For example, the display panel DP and the sensor SU may be coupled to each other by using an adhesive member (not shown). Also, in another embodiment of the inventive concept, the sensor SU may be omitted.

Figure 3:
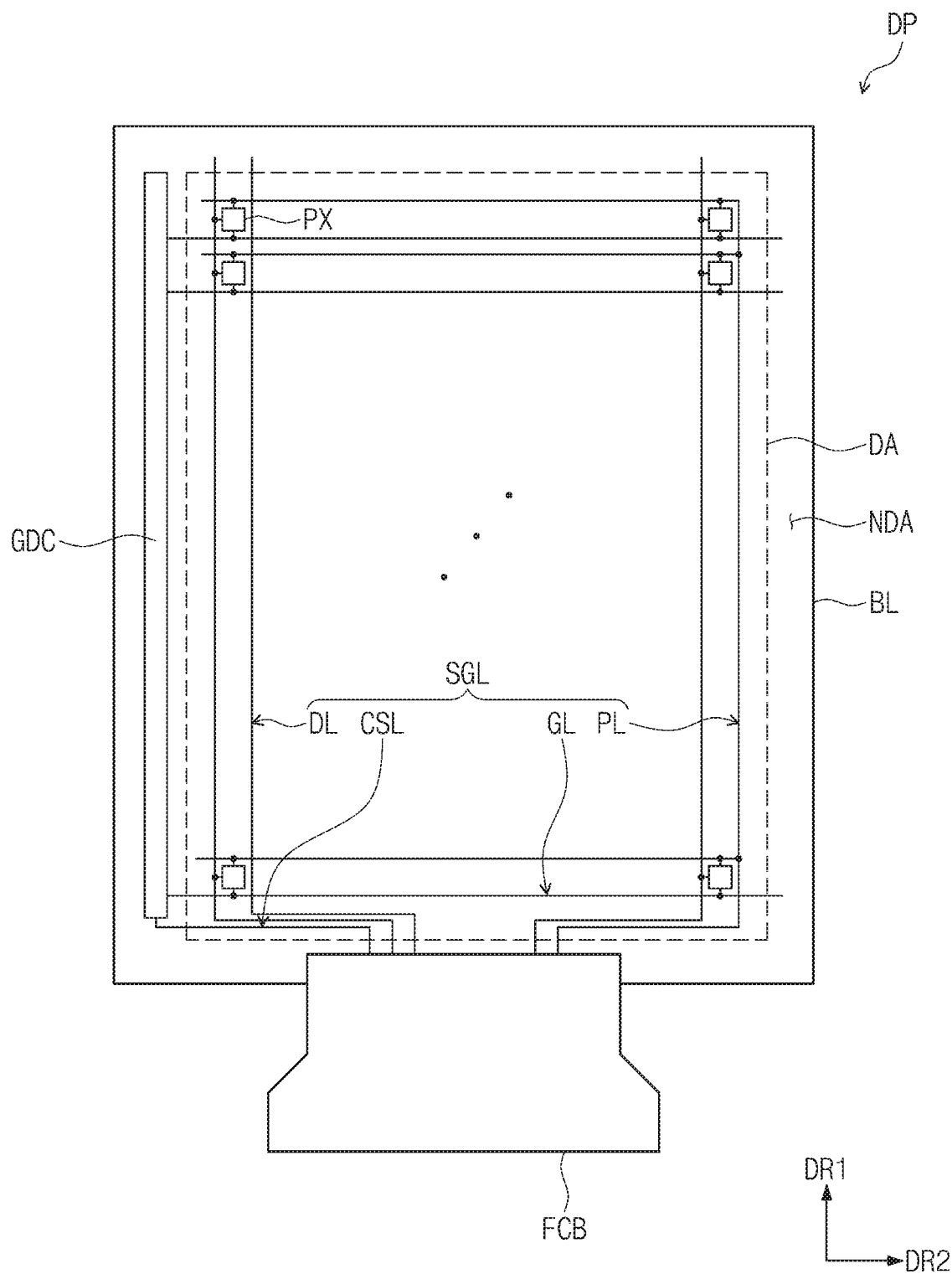
FIG. 3 is a plan view illustrating a display panel in FIG. 2.
Figure 4:
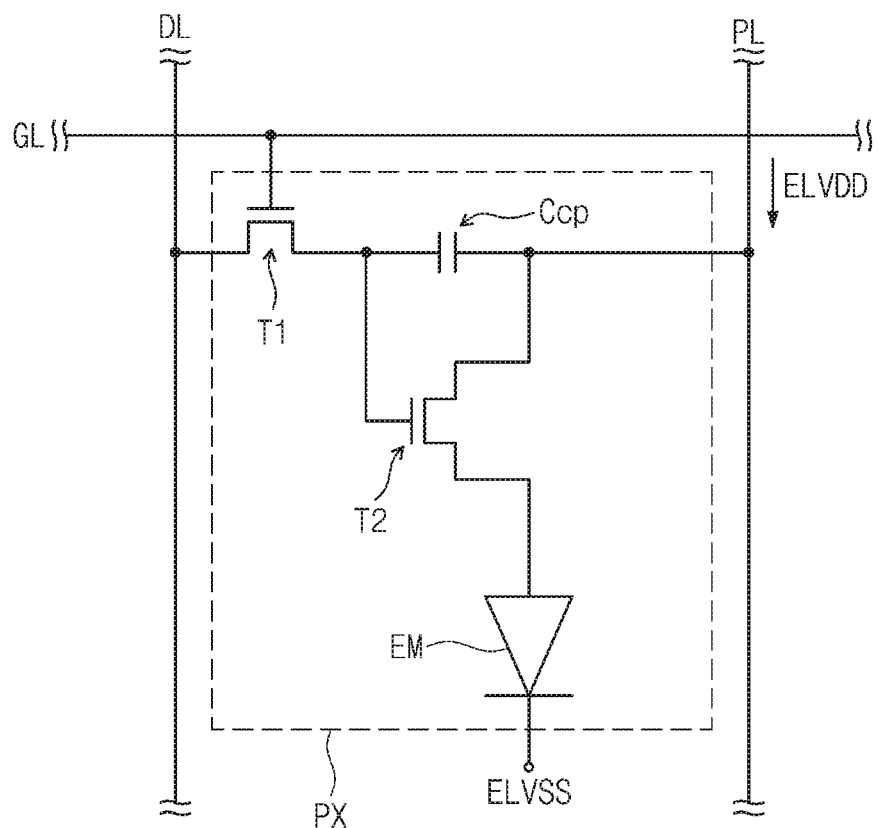
FIG. 4 is an equivalent circuit diagram illustrating a pixel in FIG. 3.

FIG. 3 is a plan view illustrating the display panel in FIG. 2, and FIG. 4 is an equivalent circuit diagram illustrating a pixel in FIG. 3.

Referring to FIG. 3, the display panel DP includes a base layer BL, a plurality of signal lines SGL, and a plurality of pixels PX. In the embodiment, a signal circuit diagram of one pixel PX is simply illustrated for easy description.

The base layer BL includes a display area DA and a non-display area NDA in a plan view. In the embodiment, a rear surface of the base layer BL may be provided as a rear surface of the display panel DP.

The display area DA may be an area on which the image IM (refer to FIG. 1) is displayed. The display panel DP activates the display area DA according to an electrical signal. The image IM is displayed on the activated display area DA.

All sorts of signal lines, which provide an electrical signal to the display area DA, or electronic elements may be disposed on the non-display area NDA. The non-display area NDA may not be seen from the outside.

The plurality of signal lines SGL and the pixels PX are disposed on the base layer BL. The signal lines SGL may include a gate lines GL, a data lines DL, and a power lines PL. The gate lines GL, the data lines DL, and the power lines PL may transmit electrical signals different from each other.

The gate lines GL extend in the second direction DR2. The gate lines GL may be provided in plurality to be spaced apart from each other in the first direction DR1.

The display panel DP may further include a driving circuit GDC disposed on the base layer BL to provide an electrical signal to the gate line GL. The driving circuit GDC may include a plurality of thin-film transistors that are manufactured through the same process as the driving circuit of the pixel PX, e.g., a low temperature polycrystalline silicon (LTPS) process or a low temperature polycrystalline oxide (LTPO) process. The signal lines SGL may further include a control signal line CSL for providing control signals to the driving circuit GDC.

The data line DL extends in the first direction DR1. The data line DL may be electrically insulated from the gate line GL. The data lines DL may be provided in plurality to be spaced apart from each other in the second direction DR2.

The power lines PL extends in the first direction DR1. The power line PL may be electrically insulated from the gate line GL and the data line DL. Although the power lines PL may be provided in plurality to be spaced apart from each other in the second direction DR2, the single power line PL is exemplarily illustrated for easy description. Each of the power lines PL may provide a power signal to the pixel PX.

The pixels PX are disposed on the display area DA. Although the pixels PX may be provided in plurality to be connected to the signal lines SGL, respectively, the single pixel PX is exemplarily illustrated for easy description. The pixels PX display the image IM by controlling an amount of light according to an electrical signal.

Referring to FIG. 4, each of the pixels PX may include a first thin-film transistor T1, a second thin-film transistor T2, a capacitor Ccp, and a light emitting element EM. The first thin-film transistor T1, the second thin-film transistor T2, the capacitor Ccp, and the light emitting element EM are electrically connected to each other.

The first thin-film transistor T1 may be a switching element for controlling turn-on and turn-off of the pixel PX. The first thin-film transistor T1 is connected to the gate line GL and the data line DL. The first thin-film transistor T1 is turned-on by a gate signal provided through the gate line GL and provides a data signal provided through the data line DL to the capacitor Ccp.

The capacitor Ccp charges a voltage corresponding to an electric potential difference between a first power signal provided from the power line PL and a signal provided from the first thin-film transistor T1. The second thin-film transistor T2 provides a first power signal ELVDD, which is provided from the power line PL corresponding to the voltage charged in the capacitor Ccp, to the light emitting element EM.

The light emitting element EM may emit light or control a light amount according to an electrical signal. For example, the light emitting element EM may include an organic light emitting element, a quantum dot light emitting element, an electrophoretic element, or an electrowetting element.

The light emitting element EM is connected to a power terminal to receive a second power signal ELVSS provided from the power line PL, which is different from the first power signal ELVDD. As a driving current corresponding to a difference between the second power signal ELVSS and an electrical signal provided from the second thin-film transistor T2 flows in the light emitting element EM, the light emitting element EM may generate light corresponding to the driving current.

However, the embodiment of the inventive concept is not limited thereto. For example, the pixel PX may include electronic elements having various configurations and arrays.

Referring to FIG. 3, a circuit board FCB is connected to one side of the display panel DP. The circuit board FCB provides an electrical signal to the display panel DP. The circuit board FCB may generate a signal controlling the image IM or a power signal and provide the generated signal to the display panel DP. The circuit board PCB may be a flexible circuit board. A driving element (not shown) may be mounted on the circuit board FCB.

The circuit board FCB is electrically and physically coupled to the display panel DP through an adhesive member (e.g., an anisotropic conductive film). The circuit board FCB may include signal lines (not shown). The circuit board FCB may be coupled to the display panel DP and then bent toward a rear surface of the base layer BL.

Figure 5:
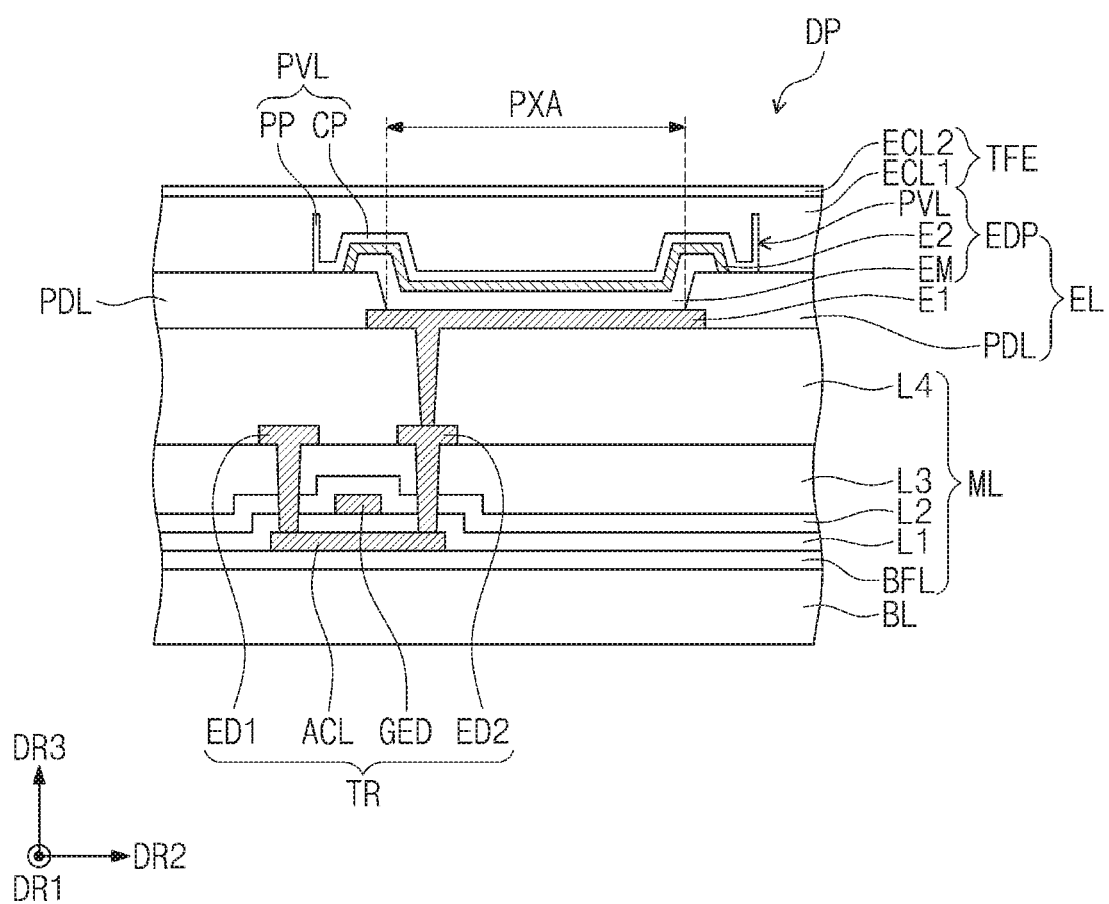
FIG. 5 is a cross-sectional view illustrating a partial configuration of the display panel in FIG. 3.

FIG. 5 is a cross-sectional view illustrating a partial configuration of the display panel in FIG. 3.

Referring to FIG. 3 and FIG. 5, the display panel DP may include the base layer BL, the circuit layer ML, the light emitting element layer EL, and the thin-film encapsulation layer TFE.

The circuit layer ML may include a transistor TR, a buffer layer BFL and a plurality of insulation layers L1, L2, L3, and L4.

The buffer layer BFL may be disposed on the base layer BL, and the transistor TR may be disposed on the buffer layer BFL. The transistor TR in FIG. 5 may be the second thin-film transistor T2 in FIG. 4. The transistor TR may include a semiconductor layer ACL, a control electrode GED, a first electrode ED1, and a second electrode ED2.

The semiconductor layer ACL may be disposed on the buffer layer BFL which provides a reformed surface to the semiconductor layer ACL. In this case, the semiconductor layer ACL may have an adhesion force greater to the buffer layer BFL than the base layer BL. Also, the buffer layer BFL may be a barrier layer for protecting a bottom surface of the semiconductor layer ACL. In this case, the buffer layer BFL may block a pollutant or moisture, which is generated from or introduced through the base layer BL, from being introduced to the semiconductor layer ACL. Also, the buffer layer BFL may be a light blocking layer for blocking external light incident through the base layer BL from being incident to the semiconductor layer ACL. In this case, the insulation layer BFL may further include a light blocking material.

The semiconductor layer ACL may include amorphous silicon or poly-silicon. Besides, the semiconductor layer ACL may include a metal oxide semiconductor. The semiconductor layer ACL may include a channel region that serves as a passages through which an electron or a hole may move, and a first ion doping region and a second ion doping region, which are disposed with the channel region disposed therebetween.

A first insulation layer L1 may be disposed on the buffer layer BFL and cover the semiconductor layer ACL. The first insulation layer L1 may include an inorganic material. The inorganic material may include at least one of silicon nitride, silicon oxynitride, silicon oxide, titanium oxide, and aluminum oxide.

The control electrode GED may be disposed on the first insulation layer L1. A second insulation layer L2 may be disposed on the first insulation layer L1 and cover the control electrode GED. The second insulation layer L2 may include an inorganic material.

A third insulation layer L3 may be disposed on the second insulation layer L2. The third insulation layer L3 may be a planarization layer providing a planarized surface and may include inorganic layer. A first electrode ED1 and a second electrode ED2 may be disposed on the third insulation layer L3. Each of the first electrode ED1 and the second electrode ED2 may be connected to the semiconductor layer ACL through through-holes passing through the first insulation layer L1, the second insulation layer L2, and the third insulation layer L3.

A fourth insulation layer L4 may be disposed on the third insulation layer L3 and cover the first electrode ED1 and the second electrode ED2. The fourth insulation layer L4 may include a single layer or a plurality of layers. For example, the single layer may include an organic layer. The plurality of layers may be provided by laminating an organic layer and an inorganic layer. The fourth insulation layer L4 may be a planarization layer providing a planarized surface.

The light emitting element layer EL may be disposed on the fourth insulation layer L4. The light emitting element layer EL includes a pixel defining pattern PDL, a plurality of first electrode layers E1, and a plurality of light emitting element patterns EDP. The pixel defining pattern PDL defines a plurality of pixel areas PXA on the base layer BL, and the first electrode layers E1 are disposed in correspondence to the plurality of pixel areas PXA, respectively. The light emitting element patterns EDP are provided on the plurality of first electrode layers E1, respectively.

The first electrode layers E1 may be disposed on the fourth insulation layer L4, and electrically connected to a corresponding second electrode ED2 through a through-hole passing through the fourth insulation layer L4.

The pixel defining pattern PDL may be disposed on the circuit layer ML to define the pixel area PXA. The pixel defining pattern PDL may be disposed on the fourth insulation layer L4 while covering at least a portion of the first electrode layers E1. One portion of the first electrode layers E1 may not be covered by the pixel defining pattern PDL, and the one portion may correspond to the pixel area PXA. Thus, the pixel defining pattern PDL may be also referred to as a pixel defining layer.

The light emitting element pattern EDP may include a light emitting layer EM, a second electrode layer E2, and a protection layer PVL. The light emitting layer EM may be disposed between the first electrode layer E1 and the second electrode layer E2. The light emitting layer EM may have a single layer structure made of a single material, a single layer structure made of materials different from each other, or a multi-layered structure including a plurality of layers made of materials different from each other.

The light emitting layer EM may include an organic material. The organic material may include conventionally used materials which emit light. However, the embodiment of the inventive concept is not limited thereto. For example, the light emitting layer EM may be made of at least one of materials each emitting red light, green light, or blue light, and include a fluorescent material or a phosphorescent material.

The second electrode layer E2 may be disposed on the light emitting layer EM. The second electrode layer E2 may receive the second power signal ELVSS (refer to FIG. 4).

The protection layer PVL may be disposed on the second electrode layer E2. The protection layer PVL may have a portion contacting a top surface of the pixel defining pattern PDL. The protection layer PVL may at least overlap edge portions of the pixel defining pattern PDL in a plan view. The protection layer PVL may protect the light emitting layer EM from moisture and oxygen. The protection layer PVL may include at least one of silicon nitride, silicon oxynitride, silicon oxide, titanium oxide, and aluminum oxide. The protection layer PVL may completely cover the top surface and side surfaces of the second electrode layer E2.

In an embodiment of the inventive concept, the protection layer PVL may include a cover portion CP and a protruding portion PP. The cover portion CP may cover the second electrode layer E2, and the protruding portion PP may extend from an end of the cover portion CP.

The cover portion CP overlaps the second electrode layer E2. The cover portion E2 may further cover a portion of the pixel defining pattern PDL.

The protruding portion PP protrudes in a thickness direction of the cover portion CP, i.e., the third direction DR3. The protruding portion PP may have a structure that is perpendicular to or inclined by a predetermined angle to a top surface of the pixel defining pattern PDL.

The thin-film encapsulation layer TFE is disposed on the protection layer PVL and the pixel defining pattern PDL. The thin-film encapsulation layer TFE may directly cover the pixel defining pattern PDL and the light emitting element pattern EDP. In another embodiment of the inventive concept, a capping layer covering the light emitting element layer EL may be further provided between the thin-film encapsulation layer TFE and the light emitting element layer EL. In this case, the thin-film encapsulation layer TFE may directly cover the capping layer.

The thin-film encapsulation layer TFE may include an organic layer ECL1 and an inorganic layer ECL2 which are sequentially laminated. The organic layer ECL1 may be formed by depositing, printing, or applying an organic material. The inorganic layer ECL2 may be formed by depositing an inorganic material.

The organic layer ECL1 protects the light emitting element pattern EL from foreign substances such as dust particles. The organic layer ECL1 may include a polymer, e.g., an acrylic-based organic layer. However, the embodiment of the inventive concept is not limited thereto. In particular, the organic layer ECL1 may provide a planarized surface by covering the entire cover portion CP and protruding portion PP of the protection layer PVL.

The inorganic layer ECL2 may block moisture and oxygen from being introduced therethrough, and include at least one of silicon nitride, silicon oxynitride, silicon oxide, titanium oxide, and aluminum oxide. The inorganic layer ECL2 may be made of the same material as the protection layer PVL.

Although the thin-film encapsulation layer TFE includes one inorganic layer and one organic layer in FIG. 5, the embodiment of the inventive concept is not limited thereto. For example, the thin-film encapsulation layer TFE may include two or more inorganic layers and two or more organic layers. In this case, the thin-film encapsulation layer TFE may have a structure in which the inorganic layers and the organic layers are alternately laminated.

Figure 6:
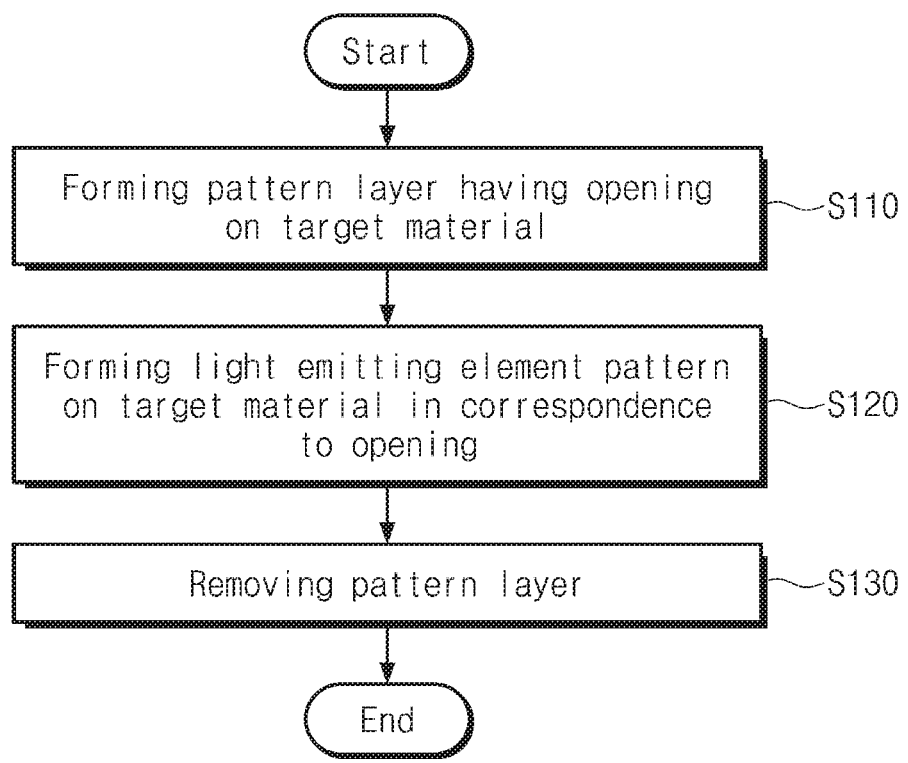
FIG. 6 is a flowchart showing a process of forming a light emitting element pattern according to an embodiment of the inventive concept.
Figure 7A:
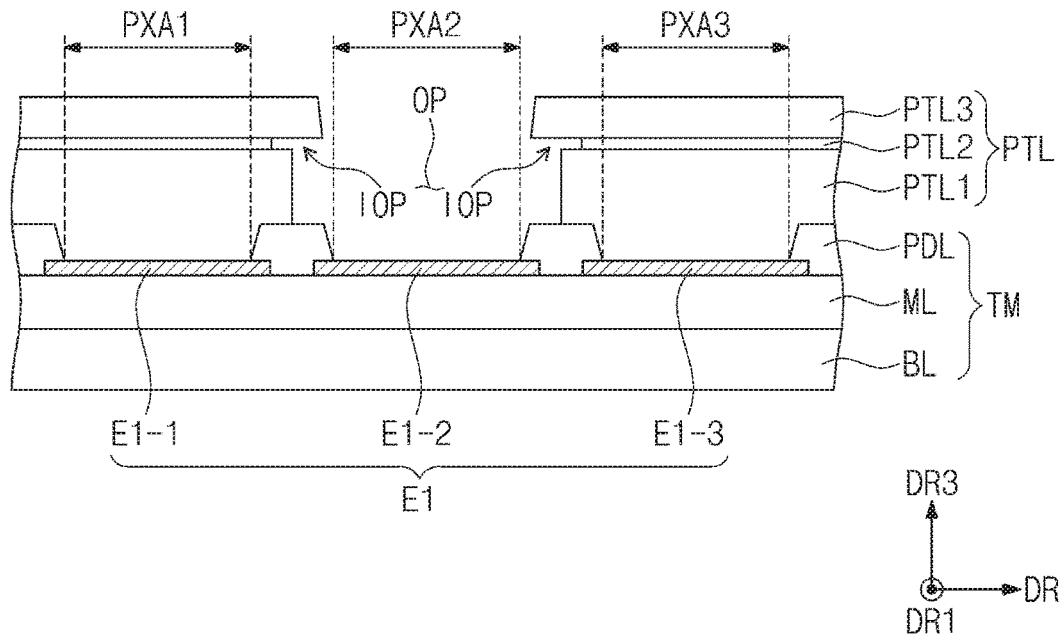
FIGS. 7A, 7B and 7C are process views illustrating a process of forming the light emitting element pattern in FIG. 6.
Figure 7B:
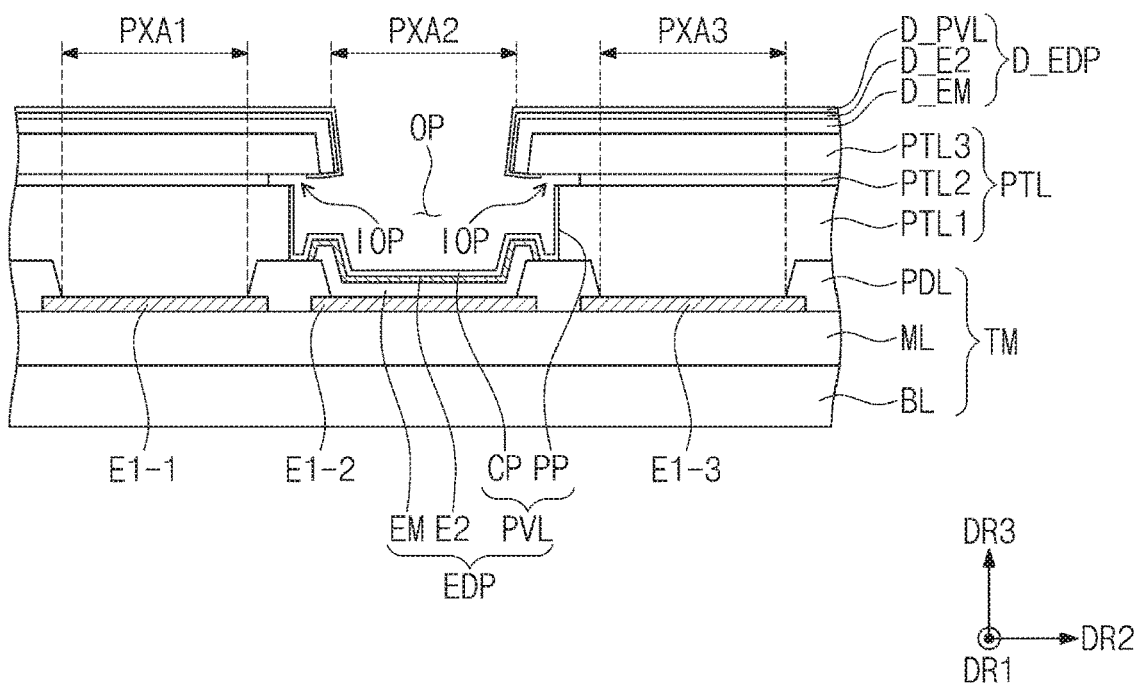
Figure 7C:
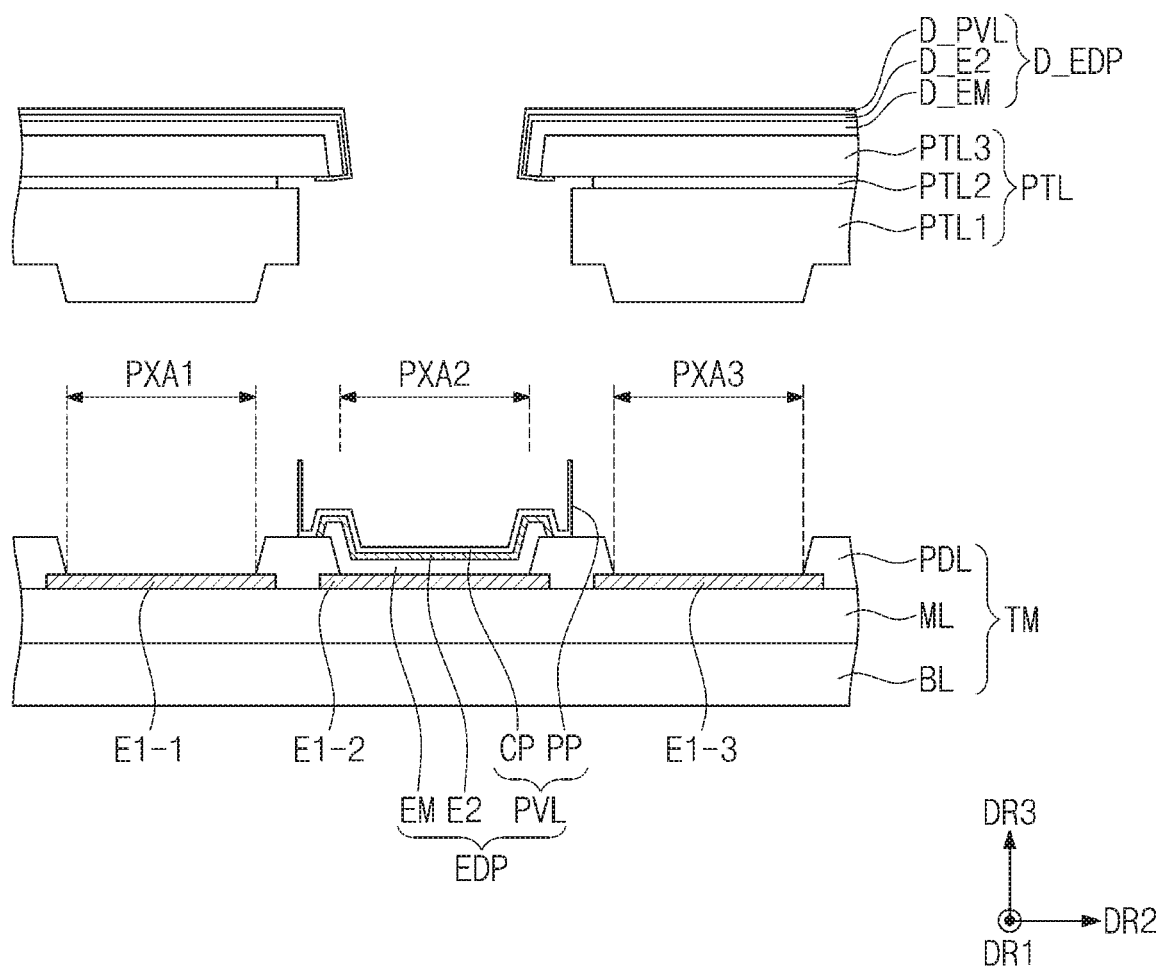

FIG. 6 is a flowchart showing a process of forming a light emitting element according to an embodiment of the inventive concept, and FIGS. 7A to 7C are process views illustrating a process of forming the light emitting element in FIG. 6.

Referring to FIGS. 6 and 7A, in the process of forming the light emitting element according to an embodiment of the inventive concept, a pattern layer PTL having an opening OP is formed on a target material TM in a step S110.

Here, the target material TM may include the base layer BL, and a pixel defining pattern PDL that defines pixel areas PXA1, PXA2, and PXA3 on the base layer BL. The target material TM may further include a circuit layer ML disposed between the base layer BL and the pixel defining pattern PDL. The target material TM may further include first electrode layers E1-1, E1-2, and E1-3. The first electrode layer E1 in FIG. 5 may be one of the first electrode layers E1-1, E1-2, and E1-3.

In an embodiment of the inventive concept, the pixel areas PXA may include the first to third pixel areas PXA1, PXA2, and PXA3. The first to third pixel areas PXA1, PXA2, and PXA3 are defined by the pixel defining pattern PDL. Here, the first electrode layers E1-1, E1-2, and E1-3 may include a first pixel electrode E1-1 provided on the first pixel area PXA1, a second pixel electrode E1-2 provided on the second pixel area PXA2, and a third pixel electrode E1-3 provided on the third pixel area PXA3.

Referring to FIG. 6 and FIG. 7B, the light emitting element pattern EDP may include first to third light emitting element patterns provided on the first to third pixels areas PXA1 to PXA3, respectively. The first light emitting element pattern is provided on the first pixel electrode E1-1 in the first pixel area PXA1, the second light emitting element pattern is provided on the second pixel electrode E1-2 in the second pixel area PXA2 and the third light emitting element pattern is provided on the third pixel electrode E1-3 in the third pixel area PXA3.

Although not shown in the drawings, the light emitting layer EM (refer to FIG. 5) of the first light emitting element pattern may be a red light emitting layer, the light emitting layer EM of the second light emitting element pattern may be a green light emitting layer, and the light emitting layer EM of the third light emitting element pattern may be a blue light emitting layer. The first to third light emitting element patterns have the same structure except for colors of the light emitting layers EM. Accordingly, hereinafter, a process of forming the second light emitting element pattern on the second pixel area PXA2 will be representatively described, and a process of forming the rest light emitting element pattern will be omitted.

For convenience of description, the light emitting element patterns disposed on the first to third pixel areas PXA1 to PXA3 are referred to as the first to third light emitting element patterns, respectively. However, hereinafter, when the process of forming the second light emitting element pattern is representatively described, the first to third light emitting element patterns are not distinguished, and described as a light emitting element pattern EDP.

Again referring to FIGS. 6 and 7A, the pattern layer PTL may include a first pattern layer PTL1, a second pattern layer PTL2, and a third pattern layer PTL3. The first pattern layer PTL1 is disposed on the target material TM, the second pattern layer PTL2 is disposed on the first pattern layer PTL1, and the third pattern layer PTL3 is disposed on the second pattern layer PTL2. The opening OP for exposing the second pixel electrode E1-2 in the second pixel area PXA2 is defined in the pattern layer PTL.

The second pattern layer PTL2 may have an undercut portion in which a sidewall of the second pattern layer PTL2 is recessed from a sidewall of the third pattern layer PTL3. Also, the first pattern layer PTL1 may have an undercut portion in which a sidewall of the first pattern layer PTL1 is recessed from a sidewall of the third pattern layer PTL3. The sidewall of the first pattern layer PTL1 which defines the opening OP may be disposed inside the sidewall of the third pattern layer PTL3 which defines the opening OP.

An inner opening IOP which is a portion of the opening OP that is recessed further from the sidewall of the first pattern layer PTL-1 and the sidewall of the third pattern layer PTL-3 may be disposed in the second pattern layer PTL-2 between the first pattern layer PTL-1 and the sidewall of the third pattern layer PTL-3. That is, a sidewall of the second pattern layer PTL2 may be recessed further than the sidewall of the first pattern layer PTL1 and the third pattern layer PTL-3. Accordingly, the inner opening IOP may be defined as an area in which the second pattern layer PTL2 is removed between the first pattern layer PTL1 and the third pattern layer PTL3.

The light emitting element pattern EDP is provided on the target material TM corresponding to the opening OP in a step S120. As illustrated in FIG. 7B, the light emitting element pattern EDP is formed on the second pixel electrode E1-2 exposed by the opening OP, and a dummy element layer D_EDP is formed on the pattern layer PTL.

The light emitting element pattern EDP may include a light emitting layer EM, a second electrode layer E2, and a protection layer PVL. The light emitting layer EM may be disposed on the second pixel electrode E1-2. That is, the light emitting layer EM of each of the pixel areas is provided on a corresponding pixel electrode of the first electrode layer E1, which is exposed through the opening OP.

The second electrode layer E2 is disposed on the light emitting layer EL. That is, the light emitting layer EM may be disposed between the second pixel electrode E1-2 and the second electrode layer E2.

The protection layer PVL covers the second electrode layer E2. The protection layer PVL may protect the light emitting layer EM from moisture and oxygen. The protection layer PVL may include at least one of silicon nitride, silicon oxynitride, silicon oxide, titanium oxide, and aluminum oxide. The protection layer PVL may be made of a material having high step coverage for protecting the light emitting layer EM.

The cover portion CP of the protection layer PVL covers the second electrode layer E2. The cover portion CP may overlap one portion of the pixel defining pattern PDL to further cover the one portion of the pixel defining pattern PDL. The protruding portion PP of the protection layer PVL may cover a sidewall of the first pattern layer PTL1. The sidewall of the first pattern layer PTL1 may be disposed adjacent to the opening OP. The protruding portion PP may at least partially cover the sidewall of the first pattern layer PTL1.

The dummy element layer D_EDP disposed on the pattern layer PTL may include a dummy light emitting layer D_EM, a dummy electrode layer D_E2, and a dummy protection layer D_PVL. The dummy light emitting layer D_EM, the dummy electrode layer D_E2, and the dummy protection layer D_PVL are sequentially laminated in the third direction DR3.

The dummy light emitting layer D_EM is separated from the light emitting layer EM, and the dummy electrode layer D_E2 is separated from the second electrode layer E2. The dummy light emitting layer D_EM and the dummy electrode layer D_E2 may be separated from the light emitting layer EM and the second electrode layer E2, respectively, due to an undercut disposed between the first pattern layer PTL1 and the third pattern layer PTL3.

The dummy protection layer D_PVL is provided to cover the dummy electrode layer D_E2. The dummy protection layer D_PVL may be made of a material having high step coverage to cover a portion of the dummy light emitting layer D_EM and a portion of the dummy electrode layer D_E2 that are formed to cover the sidewall of the third pattern layer PTL3, and a portion of a bottom surface of the third pattern layer PTL3 that is adjacent to the sidewall of the third pattern layer PTL3.

The dummy protection layer D_PVL and the protection layer PVL are formed through one process. However, the dummy protection layer D_PVL and the protection layer PVL are separated from each other due to the inner opening TOP defined between the first and third pattern layers PTL1 and PTL3.

Referring to FIGS. 6 and 7C, the process of forming the light emitting element pattern according to an embodiment of the inventive concept may include a step S130 of removing the pattern layer PTL. The removing process may be a lift-off process. When the light emitting element pattern EDP is formed on the second pixel area PXA2, the pattern layer PTL is provided to the first and third pixels areas PXA1 and PXA3. In the step S130, when the pattern layer PTL provided on the first and third pixel areas PXA1 and PXA3 is removed, the light emitting element pattern EDP may be formed on the second pixel area PXA2. When the pattern layer PTL is removed, the dummy element layer D_EDP formed on the pattern layer PTL is removed together. Thus, through the above-described process, the light emitting element pattern EDP may be formed on the second pixel area PXA2.

According to the above-described process, as the material having high step coverage is used for the protection layer PVL, a protection performance for the light emitting layer EM may improve. Also, although the material having high step coverage is used for the protection layer PVL, the dummy protection layer D_PVL on the pattern layer PTL and the protection layer PVL in the opening OP may be separated due to the inner opening TOP. Accordingly, a lift-off process of the pattern layer PTL may be easily performed, and thus reliability may improve.

The light emitting element pattern may be formed on other pixel areas PXA1 and PXA3 through the above-described process of forming the light emitting element pattern.

FIGS. 8A to 8F are process views illustrating the process of forming the pattern layer in FIG. 7A.

Figure 8A:
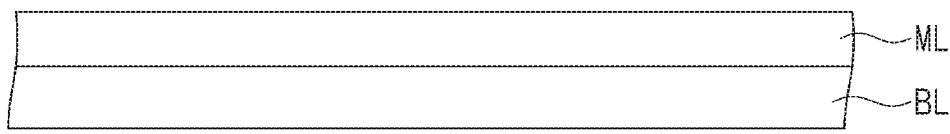
FIGS. 8A, 8B, 8C, 8D, 8E and 8F are process views illustrating a process of forming a pattern layer in FIG. 7A according to an embodiment.
Figure 8A:
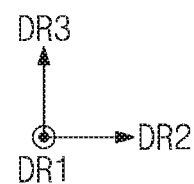

Referring to FIG. 8A, a circuit layer ML is formed on a base layer BL. Although not shown in the drawing, the circuit layer BL may have the configuration in FIG. 5.

Figure 8B:
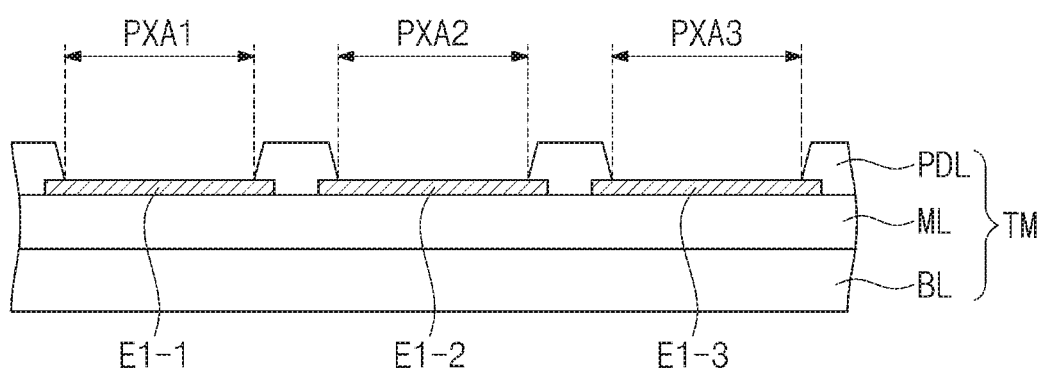
Figure 8B:
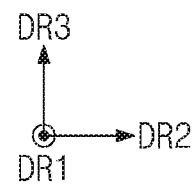

Referring to FIG. 8B, first to third pixel electrodes E1-1, E1-2, and E1-3 are formed on the circuit layer ML. The first electrode layer E1 in FIG. 5 may be one of the first to third pixel electrodes E1-1, E1-2, and E1-3.

A pixel defining pattern PDL is formed on the circuit layer ML. The pixel defining pattern PDL may cover at least a portion of the first to third pixel electrodes E1-1, E1-2, and E1-3, for example, the pixel defining pattern PDL may cover edges of the first to third pixel electrodes E1-1, E1-2, and E1-3. One area of the first to third pixel electrodes E1-1, E1-2, and E1-3, which are exposed due to not being covered by the pixel defining pattern PDL, may be defined as first to third pixel areas PXA1, PXA2, and PXA3, respectively.

Accordingly, a target material TM in FIGS. 6 and 7A may be prepared. Thereafter, a process of forming a light emitting element pattern EDP on the target material TM will be described in detail.

Figure 8C:
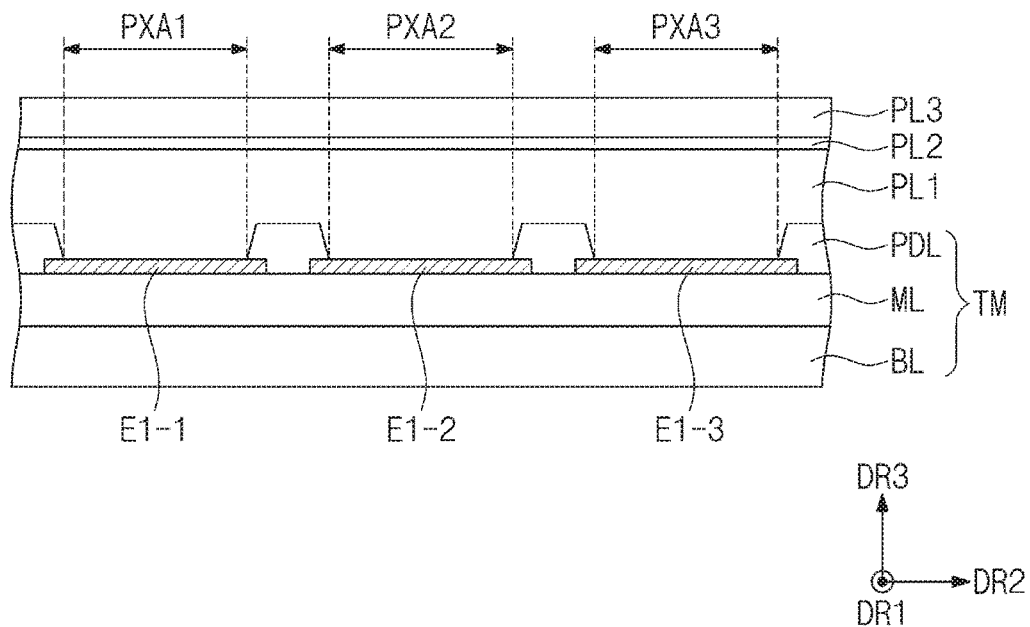

Referring to FIG. 8C, a first layer PL1 for covering the pixel defining pattern PDL and the first to third pixel electrodes E1-1, E1-2, and E1-3 is formed. The first layer PL1 may include an organic fluorine-based resin. However, the embodiment of the inventive concept is not limited to the material of the first layer PL1.

A second layer PL2 is formed on the first layer PL1. The second layer PL2 may include an inorganic material or a metallic material, for example, a metal oxide. In an embodiment of the inventive concept, the second layer PL2 may include at least one of silicon nitride, silicon oxynitride, silicon oxide, titanium oxide, and aluminum oxide. The second layer PL2 may have a thickness of several hundreds Å to several thousands Å.

A third layer PL3 is formed on the second layer PL2. The third layer PL3 may include a photosensitive chemical material.

Figure 8D:
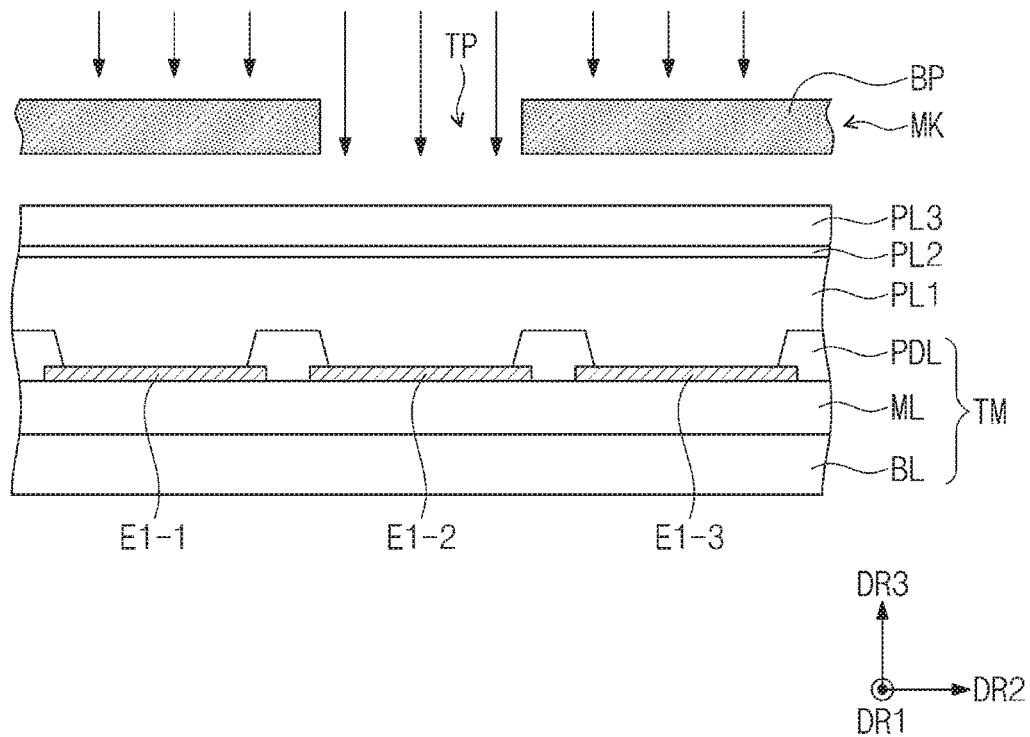

Referring to FIG. 8D, a mask MK is disposed above the third layer PL3. The mask MK may be a binary mask including a transmission part TP and a light blocking part BP.

The third layer PL3 may be a positive photoresist layer or a negative photoresist layer. Hereinafter, a case in which the third layer PL3 is the positive photoresist layer will be exemplarily described.

The light blocking part BP may overlap the first pixel area PXA1 and the third pixel area PXA3. The transmission part TP may overlap the second pixel area PXA2. After the mask BK is arranged above the third layer PL3, light is irradiated to perform an exposure process. Then, a portion of the third layer PL3 which corresponds to the light blocking part BP is not exposed, and only a portion of the third layer PL3 which corresponds to the transmission part TP is exposed.

Figure 8E:
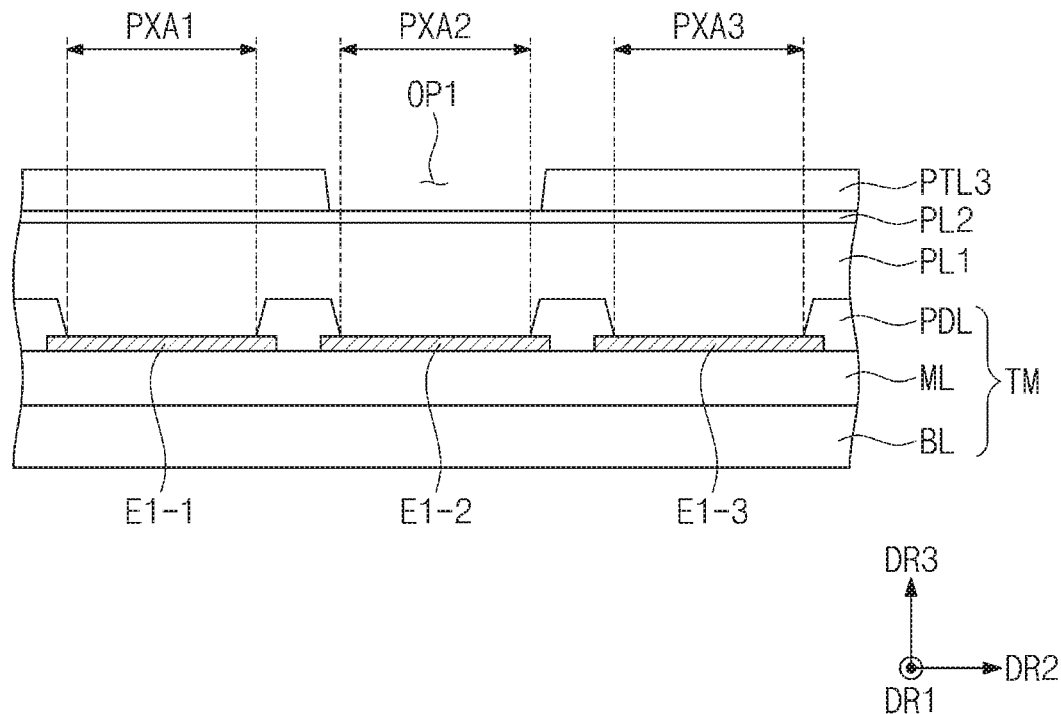

Thereafter, as illustrated in FIG. 8E, by developing the exposed portion of the third layer PL3, the third pattern layer PTL3 having a first opening OP1 is formed in the second pixel area PXA2.

Figure 8F:
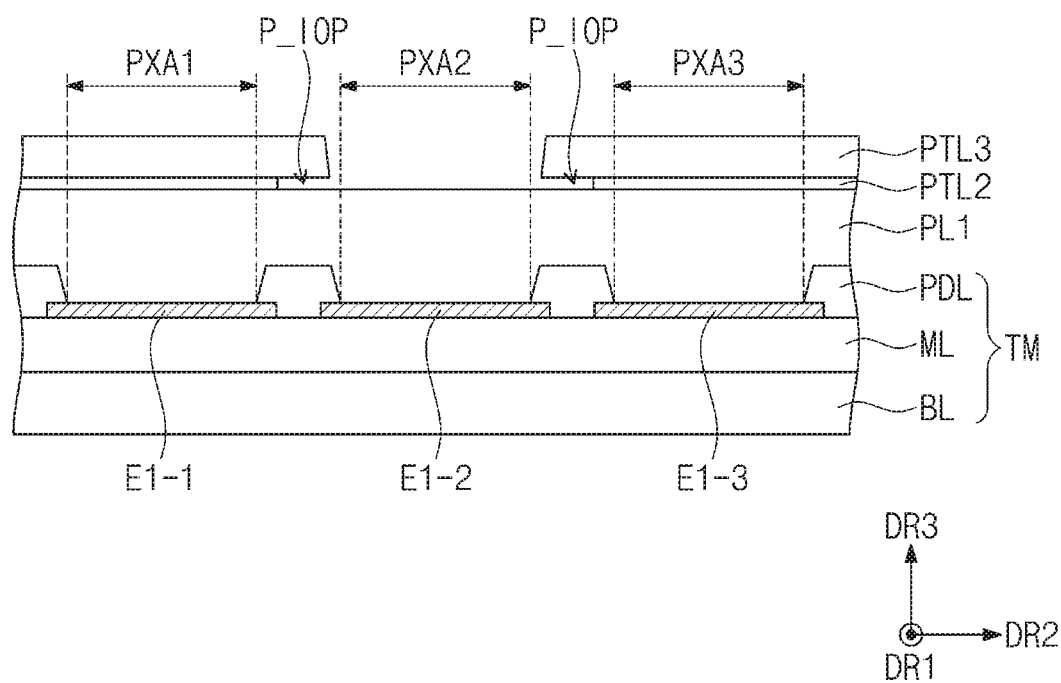

By patterning the second layer PL2 using the third pattern layer PTL3 as a mask, the second pattern layer PTL2 in FIG. 8F is formed. The patterning process of the second layer PL2 may be an etching process. That is, when the second layer PL2 is etched by using the third pattern layer PTL3 as a mask, the second pattern layer PTL2 is formed. The etching process of the second layer PL2 may be an isotropic etching process.

The second pattern layer PTL2 may have an undercut portion recessed from the edges of the third pattern layer PTL3. Accordingly, a preliminary inner opening P_IOP may be provided between the third pattern layer PTL3 and the first layer PL1 due to the undercut. That is, the preliminary inner opening P_IOP may be defined as an area in which the second layer PL2 between the third pattern layer PTL3 and the first layer PL1 is removed.

Thereafter, the first pattern layer PTL1 in FIG. 7A may be formed by etching the first pattern layer PTL1 using the third pattern layer PTL3 as a mask. Here, the patterning process of the first layer PL1 may be an etching process. That is, when the first layer PL1 is etched by using the third pattern layer PTL3 as a mask, the first pattern layer PTL1 is formed. Here, the patterning process of the first layer PL1 may be an anisotropic etching process.

Referring to FIGS. 7A and 8F, as the first layer PL1 is removed from the second pixel area PXA2, the pattern layer PTL having the opening OP may be formed in the second pixel area PXA2. An inner opening IOP that is formed from the preliminary inner opening P_IOP may be provided on the pattern layer PTL. The inner opening IOP may be defined as an area in which the second pattern layer PTL2 between the third pattern layer PTL3 and the first layer PL1 is removed.

FIGS. 9A to 9F are process views illustrating a process of forming a pattern layer according to another embodiment.

Figure 9A:
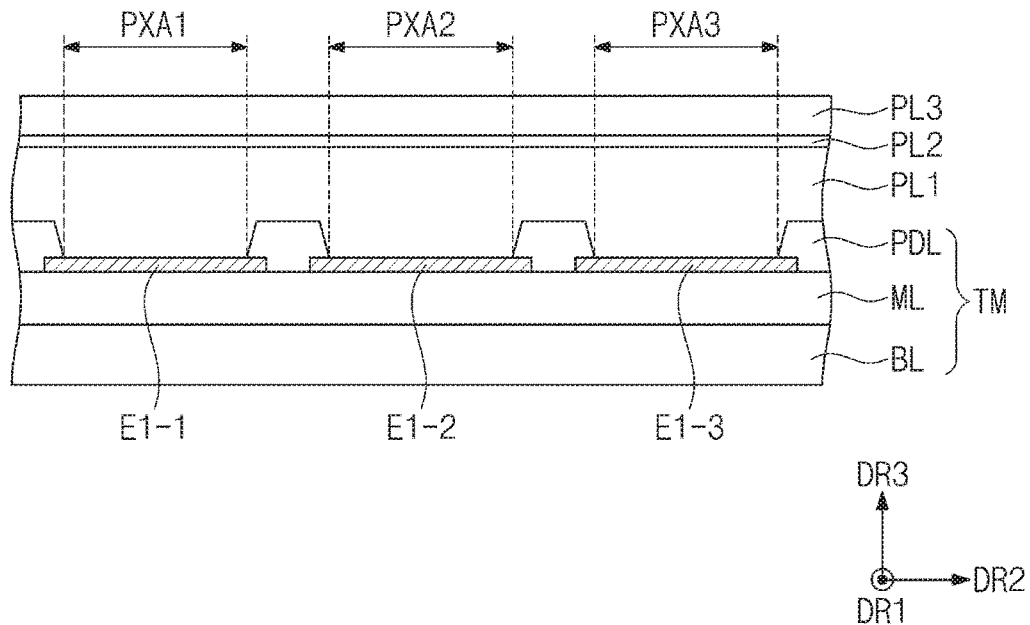
FIGS. 9A 9B, 9C, 9D, 9E and 9F are process views illustrating a process of forming a pattern layer according to another embodiment.

Referring to FIG. 9A, first to third layers PL1 to PL3 are sequentially formed on a target material TM including a pixel defining pattern PDL and first to third pixel electrodes E1-1, E1-2, and E1-3. The target material TM may have the same structure as the target material TM in FIGS. 8A and 8B.

The first to third layers PL1 to PL3 may have the same material and structure as the first to third layers PL1 to PL3 in FIG. 8C.

Figure 9B:
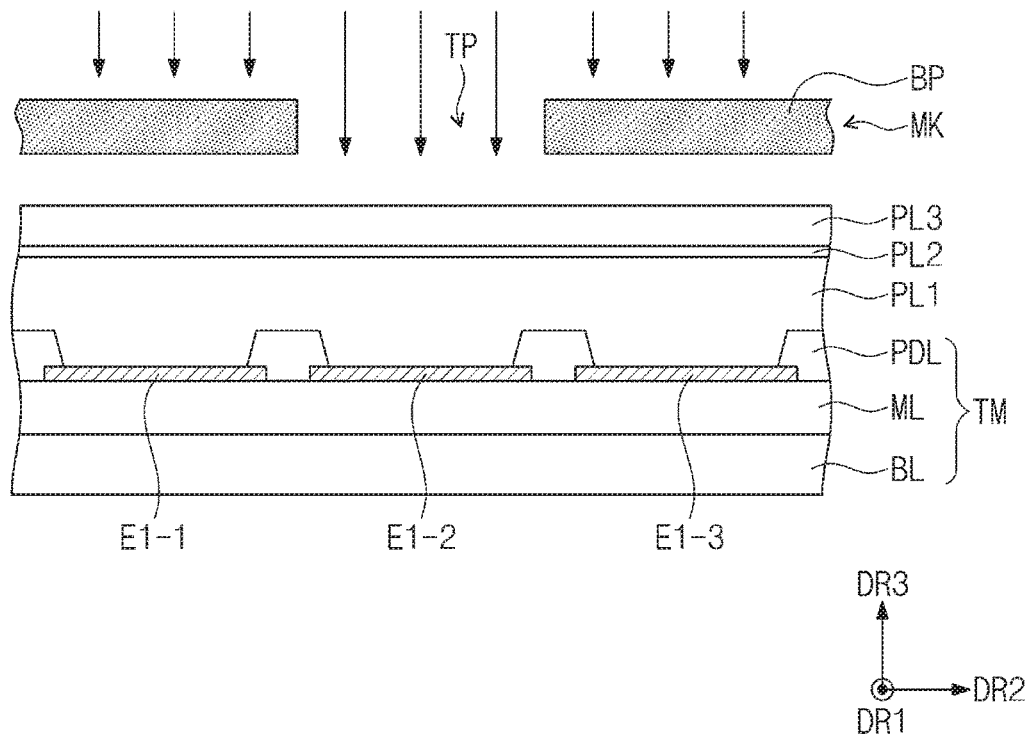
Figure 9C:
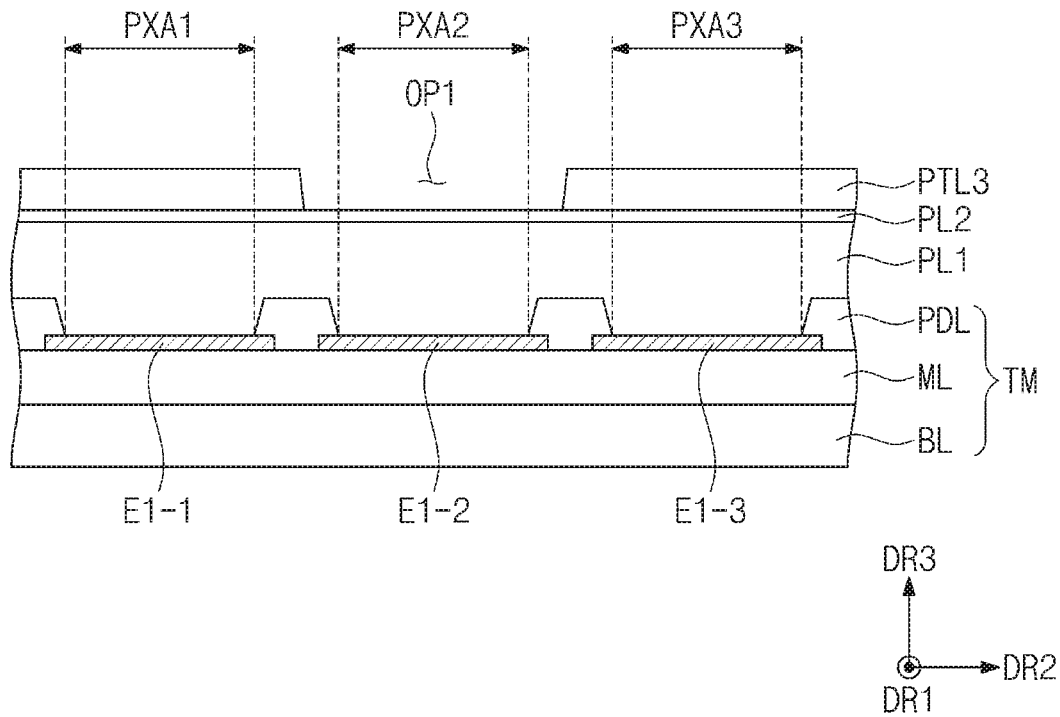

Referring to FIGS. 9B and 9C, a mask MK is arranged above the third layer PL3. The third layer PL3 may be patterned by using the mask MK. The patterning process of the third layer PL3 may be a photolithography process. Since the patterning process of the third layer PL3 is similar to that in FIGS. 8D and 8E, detailed description will be omitted.

After the patterning process of the third layer PL3, a third pattern layer PTL3 including a first opening OP1 is formed. When the second layer PL2 is patterned by using the third pattern layer PTL3 as a mask, a preliminary pattern layer P_PTL2 is formed as in FIG. 9D. The patterning process of the second layer PL2 may be an etching process. That is, when the second layer PL2 is etched by using the third pattern layer PTL3 as a mask, a preliminary pattern layer P_PTL2 is formed. Here, the etching process of the second layer PL2 may be an anisotropic etching process.

Figure 9D:
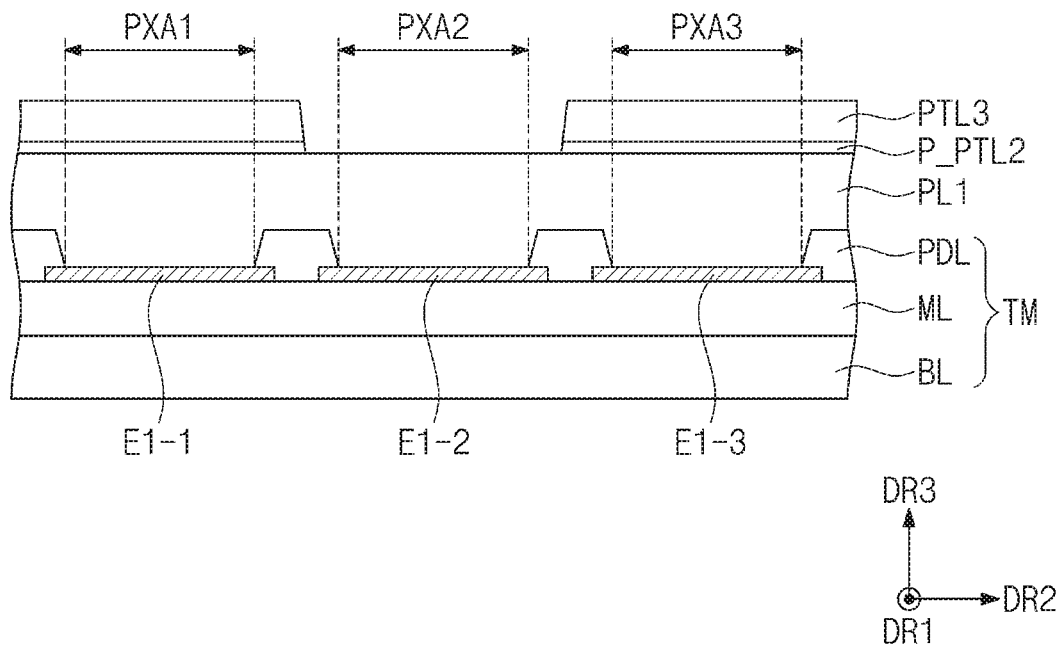

Unlike the embodiment in FIG. 8F, the preliminary pattern layer P_PTL2 in FIG. 9D may be formed by etching the second layer PL2 in an anisotropic etching method. Accordingly, the preliminary pattern layer P_PTL2 may not have an undercut portion which is recessed from edges of the third pattern layer PTL3 because the second layer PL2 is etched by using the anisotropic etching process.

Figure 9E:
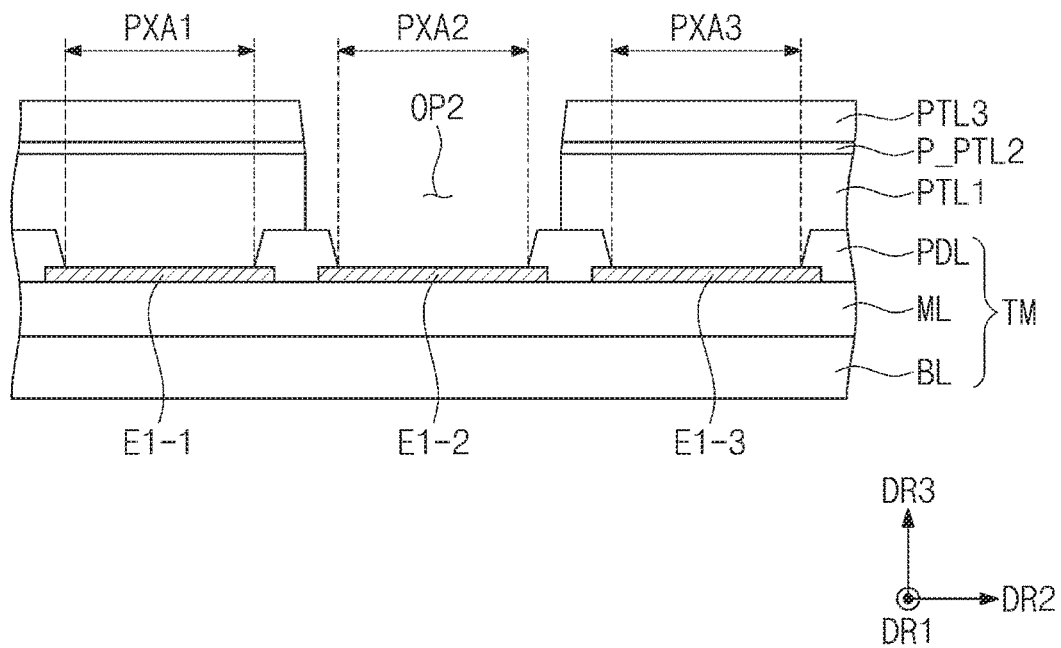

Thereafter, the first pattern layer PTL1 in FIG. 9E may be formed using the preliminary pattern layer P_PTL2 and the third pattern layer PTL3 as a mask, Here, the patterning process of the first layer PL1 may be an etching process. The etching process of the first layer PL1 may be an anisotropic etching process.

As described above, as the first layer PL1 is removed from the second pixel area PXA2, a second opening OP2 may be formed in the second pixel area PXA2.

Figure 9F:
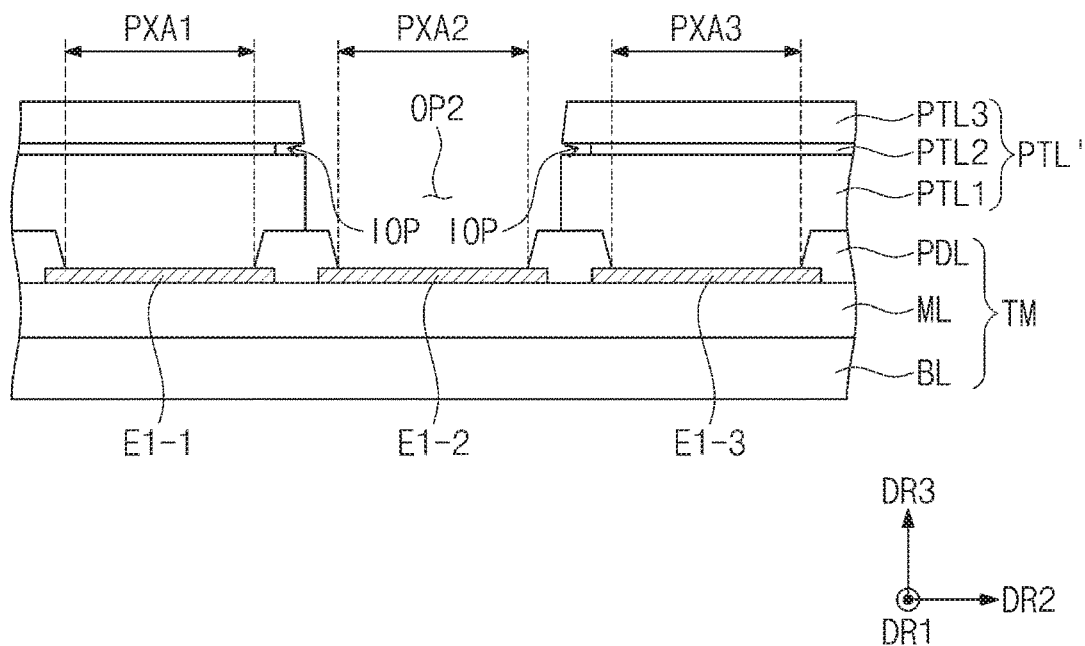

Thereafter, the preliminary pattern layer P_PTL2 is etched to have an undercut between the first pattern layer PTL1 and third pattern layer PTL3 by etching the preliminary pattern layer P_PTL2 laterally using an isotropic etching process. As illustrated in FIG. 9F, the second pattern layer PTL2 including the inner opening IOP may be formed. The inner opening IOP may be defined as an area in which the preliminary pattern layer P_PTL2 between the third pattern layer PTL3 and the first layer PL1 is removed.

As a result, a pattern layer PTL' according to another embodiment of the inventive concept may be completed. Since a process of forming a light emitting element pattern using the pattern layer PTL' is similar to that in FIGS. 6 and 7A to 7C, description on following processes will be omitted.

Figure 10:
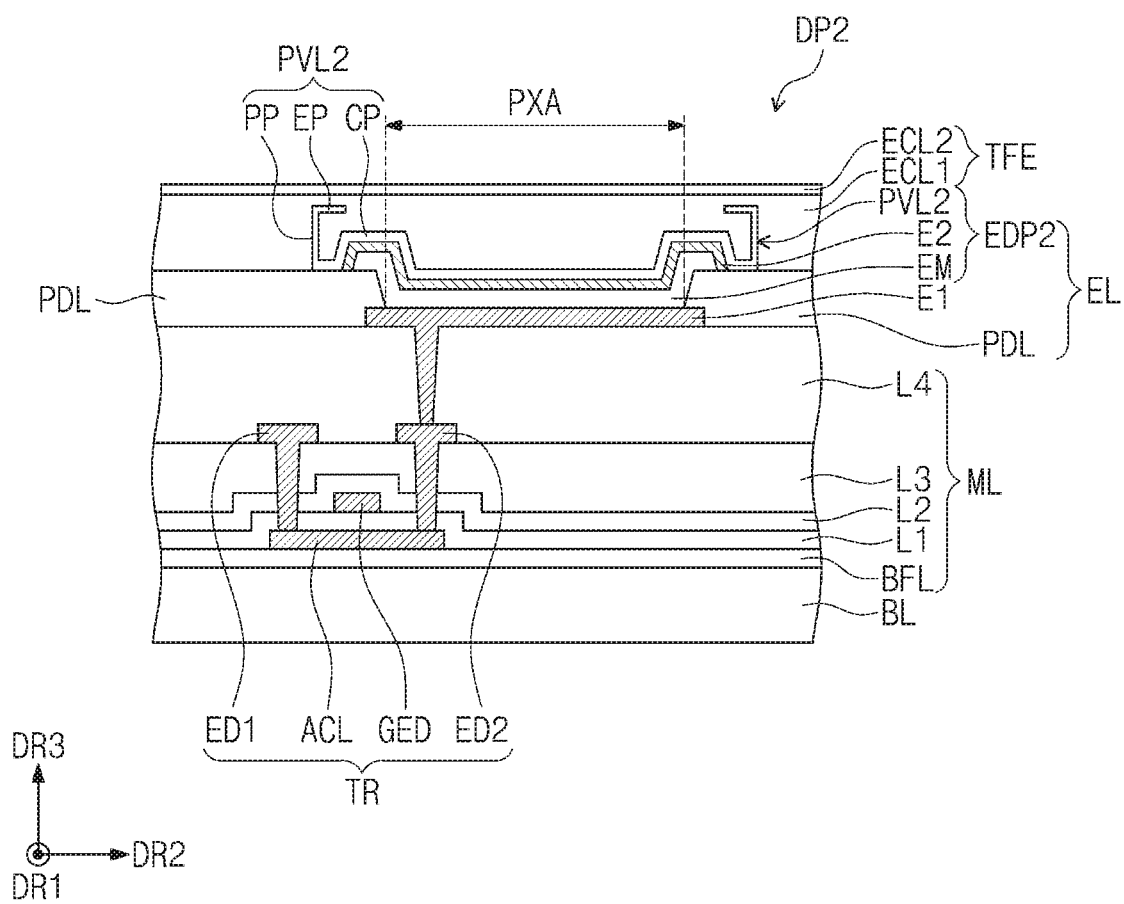
FIG. 10 is a cross-sectional view illustrating a partial configuration of a display panel according to another embodiment of the inventive concept.

FIG. 10 is a cross-sectional view illustrating a partial configuration of a display panel according to another embodiment of the inventive concept. FIGS. 11A to 11I are process views illustrating a process of forming the light emitting element pattern in FIG. 10. The same components as those in FIG. 5 among the components in FIG. 10 will be given by the same reference numerals, and detailed description will be omitted.

Since a display panel DP2 in FIG. 10 has the same structure as the display panel DP in FIG. 5 except for a feature of including a light emitting element pattern EDP2 that is different in structure from the light emitting element pattern EDP of the display panel DP in FIG. 5, the light emitting element pattern EDP2 will be specifically described in FIG. 10.

Referring to FIG. 10, the light emitting element pattern EDP2 may include a light emitting layer EM, a second electrode layer E2, and a protection layer PVL2. The light emitting layer EM is disposed between the first electrode layer E1 and the second electrode layer E2. The light emitting layer EM may have a single layer structure made of a single material, a single layer structure made of materials different from each other, or a multi-layered structure including a plurality of layers made of materials different from each other.

The light emitting layer EM may include an organic material. The organic material may include conventionally used materials which emit light. However, the embodiment of the inventive concept is not limited thereto. For example, the light emitting layer EM may be made of at least one of materials each emitting red light, green light, or blue light, and include a fluorescent material or a phosphorescent material.

The second electrode layer E2 may be disposed on the light emitting layer EM, and the protection layer PVL2 may be disposed on the second electrode layer E2. The protection layer PVL2 may have a portion contacting the pixel defining pattern PDL. The protection layer PVL2 may at least overlap edge portions of the pixel defining pattern PDL in a plan view.

The protection layer PVL2 may include a cover portion CP, a protruding portion PP, and an extension portion EP. The cover portion CP may cover the second electrode layer E2, and the protruding portion PP may protrude from the cover portion CP in the third direction DR3. The extension portion EP extends from an end of the protruding portion PP in the second direction DR2 toward the second electrode layer E2.

The cover portion CP overlaps the second electrode layer E2. The cover portion E2 may further cover a portion of the pixel defining pattern PDL.

The protruding portion PP protrudes in a thickness direction of the cover portion CP, i.e., the third direction DR3. The protruding portion PP may have a structure that is perpendicular to or inclined by a predetermined angle to a top surface of the pixel defining pattern PDL.

The extension part EP may extend from the protruding portion PP to overlap the cover portion CP. A space between the extension portion EP and the cover portion CP may be filled with an encapsulation layer TFE. In particular, an organic layer ECL1 of the encapsulation layer TFE may provide a planarized surface by entirely covering the cover portion CP, protruding portion PP, and the extension portion EP.

Figure 11A:
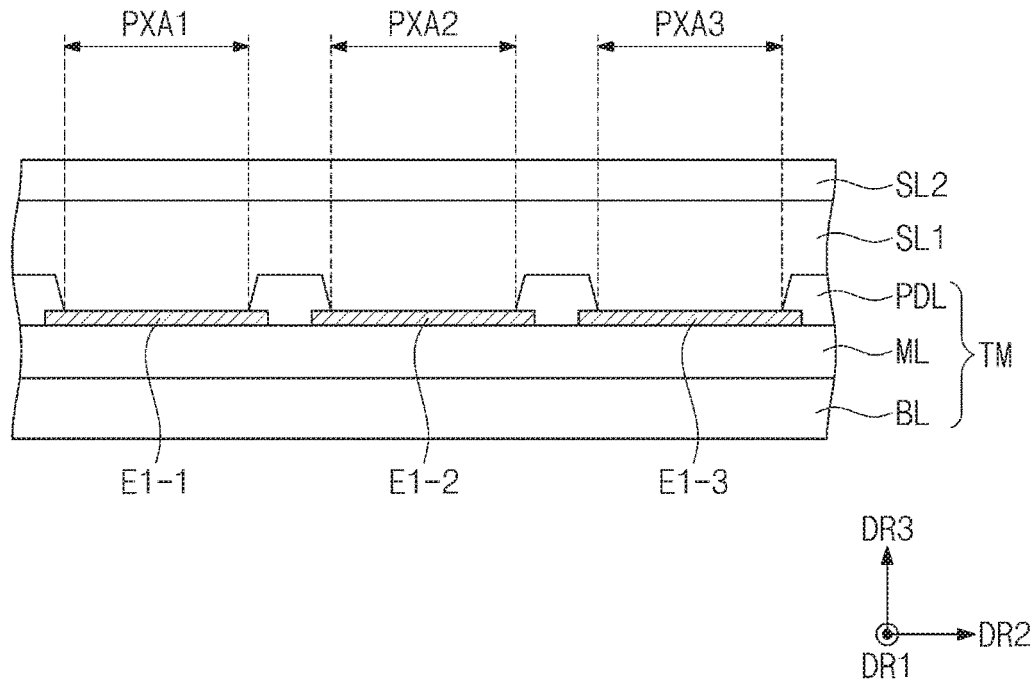
FIGS. 11A, 11B, 11C, 11D, 11E, 11F, 11G, 11H and 11I are process views illustrating a process of forming a light emitting element pattern in FIG. 10.

Referring to FIG. 11A, a first layer SL1 covering a pixel defining pattern PDL and first to third pixel electrodes E1-1, E1-2, and E1-3 is formed on a target material TM. The first layer SL1 may include an organic fluorine-based resin. However, the embodiment of the inventive concept is not limited to the material of the first layer SL1.

A second layer SL2 is formed on the first layer SL1. The second layer SL2 may include a photosensitive chemical material.

Figure 11B:
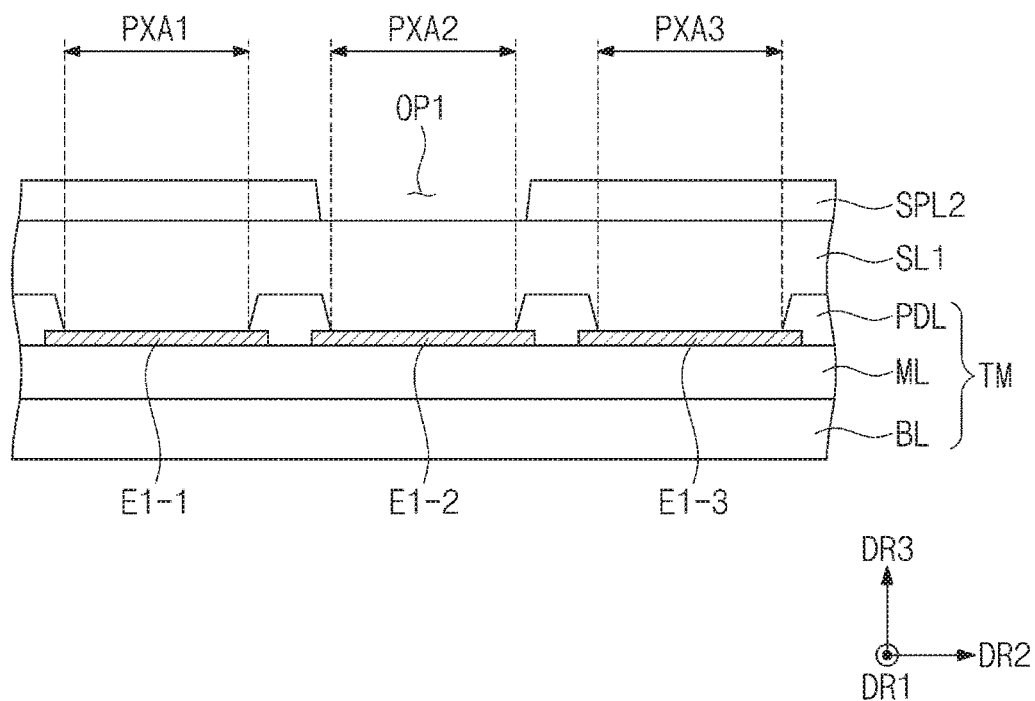

Referring to FIG. 11B, a second sub-pattern layer SPL2 having a first opening OP1 is formed by patterning the second layer SL2. The patterning process of the second layer SL2 may be a photoresist process. The patterning process of the second layer SL2 may include exposure and developing processes. The second layer SL2 may be one of a positive photoresist layer or a negative photoresist layer.

After the patterning process of the second layer SL2, the second sub-pattern layer SPL2 including a first opening OP1 is formed. A first sub-pattern layer SPL1 is formed by patterning the first layer SL1 using the second sub-pattern layer SPL2 as a mask, as illustrated in FIG. 11C.

In another embodiment, the patterning process of the first layer SL1 may be a developing process. That is, the first layer SL1 may be developed by adjusting a developing time in a process of developing the second layer SL2. As the first layer SL1 is additionally developed by increasing the developing time, the first layer SL1 corresponding to the first opening OP1 may be removed, and the first sub-pattern layer SPL1 is formed. In the developing processes of the first and second layers SL1 and SL2, the same developing solution may be used. The developing solution used for the developing processes of the first and second layers SL1 and SL2 may be tetra methyl ammonium hydroxide (TMAH).

For another example, the patterning process of the first layer SL1 may be an etching process. That is, when the first layer SL1 is etched by using the second sub-pattern layer SPL2 as a mask, the first sub-pattern layer SPL1 is formed. Accordingly, a first pattern layer SPTL1 including an opening OP is formed on the target material TM.

Figure 11C:
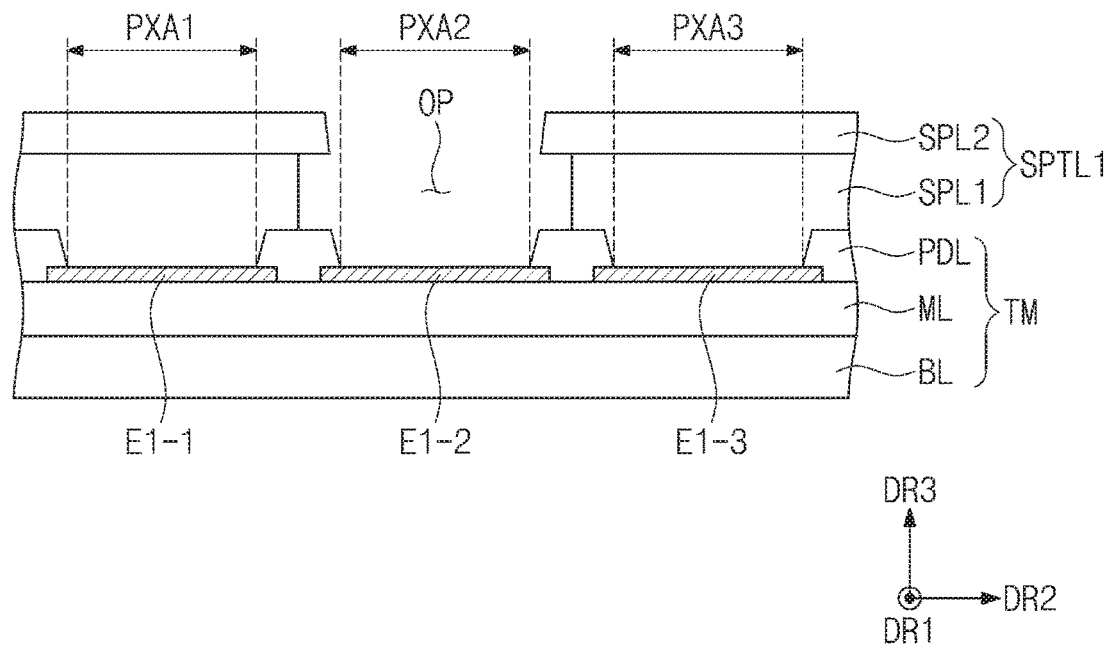

As illustrated in FIG. 11C, the first sub-pattern layer SPL1 may have an undercut portion which is recessed from edges of the second sub-pattern layer SPL2.

Figure 11D:
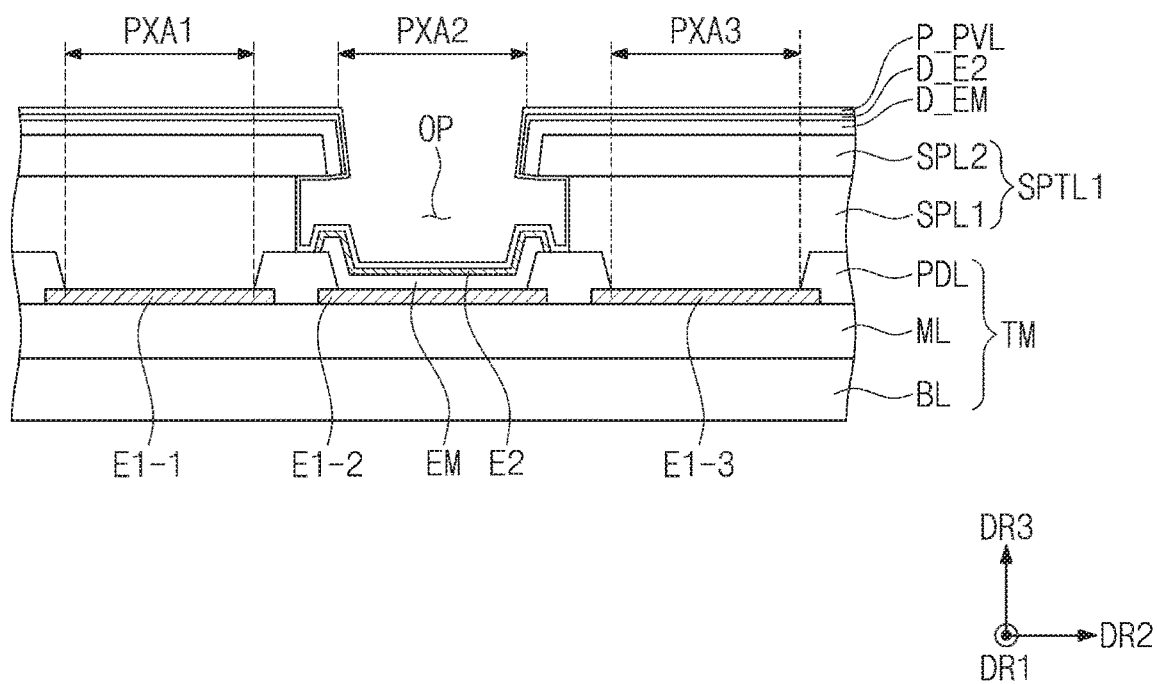

Referring to FIG. 11D, a light emitting layer EM and a second electrode layer E2 are sequentially provided on the target material TM in correspondence to the opening OP of the first pattern layer SPTL1. A dummy light emitting layer D_EM and a dummy electrode layer D_E2 are sequentially provided on the first pattern layer SPTL1. Although the light emitting layer EM and the dummy light emitting layer D_EM are provided on the target material TM through the same process, the light emitting layer EM and the dummy light emitting layer D_EM are separated by the undercut structure of the first sub-pattern layer SPL1. Also, although the second electrode layer E2 and the dummy electrode layer D_E2 are provided on the target material through the same process, the second electrode layer E2 and the dummy electrode layer D_E2 are separated by the undercut structure of the first sub-pattern layer SPL1.

A preliminary protection layer P_PVL is provided on the target material TM to cover the second electrode layer E2 and the dummy electrode layer D_E2. The preliminary protection layer P_PVL may cover a portion of the first pattern layer SPTL1, which is exposed by the second electrode layer E2 and the dummy electrode layer D_E2. In an embodiment of the inventive concept, the preliminary protection layer P_PVL may partially cover a sidewall of the first sub-pattern layer SPL1 which is adjacent to the opening OP and a bottom surface of the second sub-pattern layer SPL2, which is exposed by the opening OP. The preliminary protection layer P-PVL may have an integrated structure without having a disconnected portion under the second sub-pattern layer SPL2.

Figure 11E:
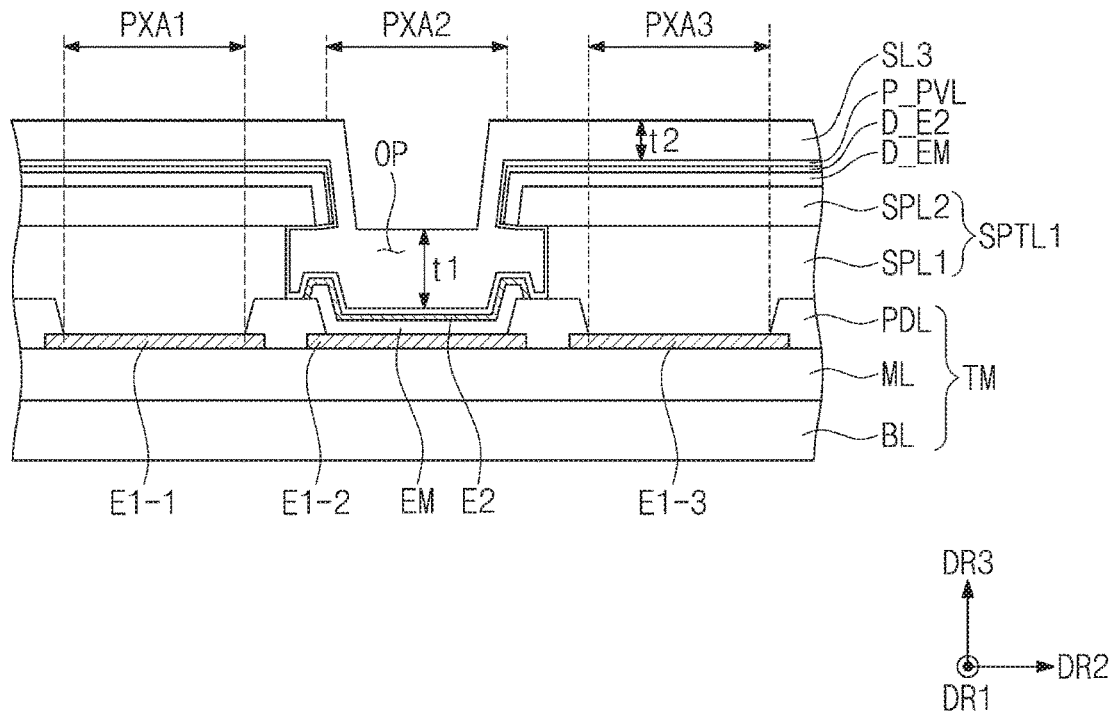

Referring to FIG. 11E, a third layer SL3 is formed on the preliminary protection layer P_PVL. The third layer SL3 may include a photosensitive chemical material.

Figure 11F:
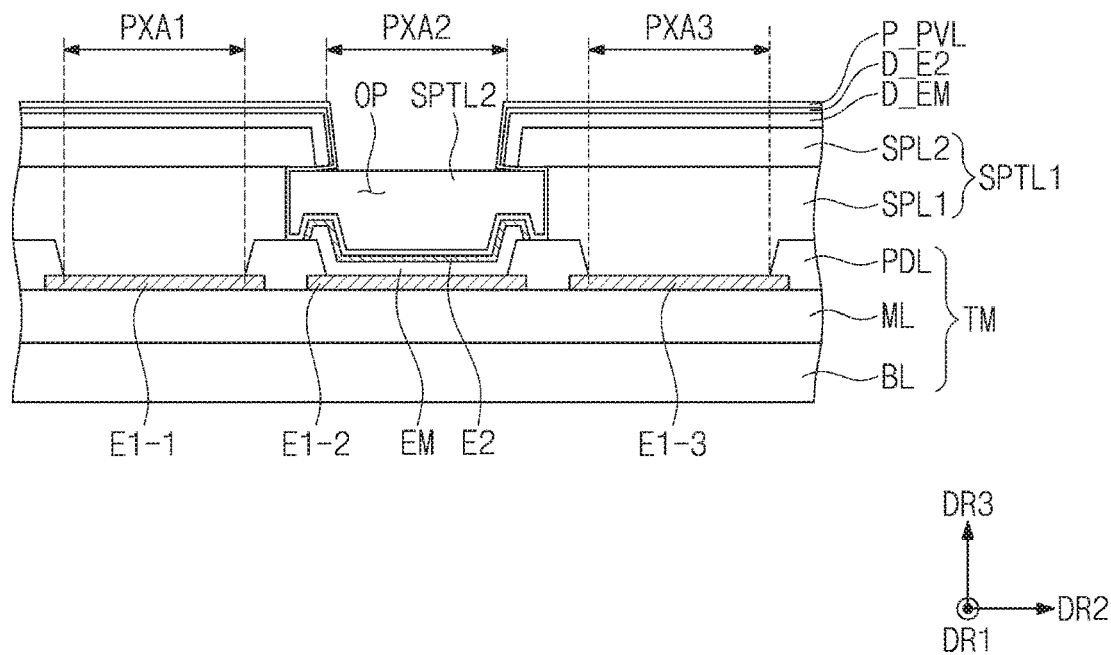

A second pattern layer SPTL2 in FIG. 11F is formed by patterning the third layer SL3. The patterning process of the third layer SL3 may be a photoresist process. The patterning process of the third layer SL3 may include exposure and developing processes. The third layer SL3 may be one of a positive photoresist layer or a negative photoresist layer.

The third layer SL3 may be a photoresist layer having a different type from the second layer SL2 in FIG. 11A. For example, when the second layer SL2 is a positive photoresist layer, the third layer SL3 may be a negative photoresist layer. When the second and third layers SL2 and SL3 are photoresist layers having different types from each other, the second layer SL2 and the third layer SL3 may be patterned by using the same mask.

The second pattern layer SPTL2 may be formed on the preliminary protection layer P_PVL in correspondence to the opening OP. In an embodiment of the inventive concept, the second pattern layer SPTL2 may partially overlap a bottom surface of the second sub-pattern layer SPL2. Accordingly, the second pattern layer SPTL2 may be formed to cover a portion of the preliminary protection layer P_PVL disposed below the bottom surface of the second sub-pattern layer SPL2.

In another embodiment of the inventive concept, the patterning process of the third layer SL3 may include only a patterning process. The third layer SL3 disposed in the opening OP may have a thickness t1 that is greater than a thickness t2 of the third layer SL3 disposed on the first pattern layer SPTL1. In this case, a process of forming the third layer SL3 may be performed. Due to the above-described thickness difference, the third layer SL3 disposed in the opening OP may be remained even after the third layer SL3 on the first pattern layer SPTL1 is removed. The third layer SL3 remained in the opening OP may be formed into the second pattern layer SPTL2.

The second pattern layer SPTL2 may cover the light emitting layer, the second electrode layer E2, and a portion of the preliminary protection layer P_PVL, which are intended to be remained in the opening OP.

Referring to FIG. 11F, the light emitting layer EM, the second electrode layer E2, and a portion of the preliminary protection layer P_PVL which are covered by the second pattern layer SPTL2 are remained in the opening OP, and the dummy light emitting layer D_EM, the dummy electrode layer D_E2, and the rest portion of the preliminary protection layer which are not covered by the second pattern layer SPTL2 are removed. The dummy light emitting layer D_EM, the dummy electrode layer D_E2, and the rest portion of the preliminary protection layer P_PVL may be removed through an etching process. Here, the etching process may be a dry etching process.

Figure 11G:
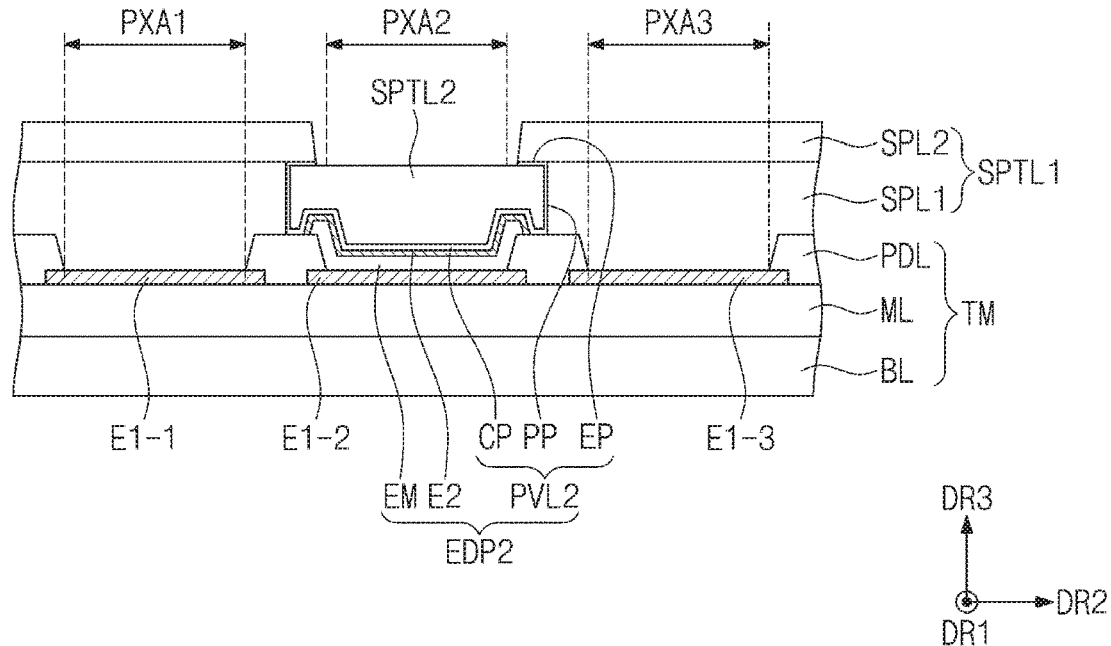

After the etching process, the dummy light emitting layer D_EM covering the second sub-pattern layer SPL2, the dummy electrode layer D_E2 and the rest portion of the preliminary protection layer P_PVL are removed. Then, as illustrated in FIG. 11G, a top surface of the second sub-pattern layer SPL2 may be exposed.

Also, a light emitting layer EM, a second electrode layer E2, and a protection layer PVL2 may be remained in the opening OP. Here, the protection layer PVL2 may include a cover portion CP, a protruding portion PP, and an extension portion EP. The cover portion CP may cover the second electrode layer E2, and the protruding portion PP may protrude from an end of the cover portion CP in the third direction DR3. The extension portion EP extends from an end of the protruding portion PP in the second direction DR2. The extension portion EP may cover a top surface of the second pattern layer SPTL2, and the protruding portion PP may cover a sidewall of the second pattern layer SPTL2. The cover portion CP may be covered by a bottom surface of the second pattern layer SPTL2.

As described above, since the cover portion CP, protruding portion PP, and extension portion EP of the protection layer PVL2 are covered by the second pattern layer SPTL2, the cover portion CP, protruding portion PP, and extension portion EP of the protection layer PVL2 may be remained without being etched even after the etching process.

Figure 11H:
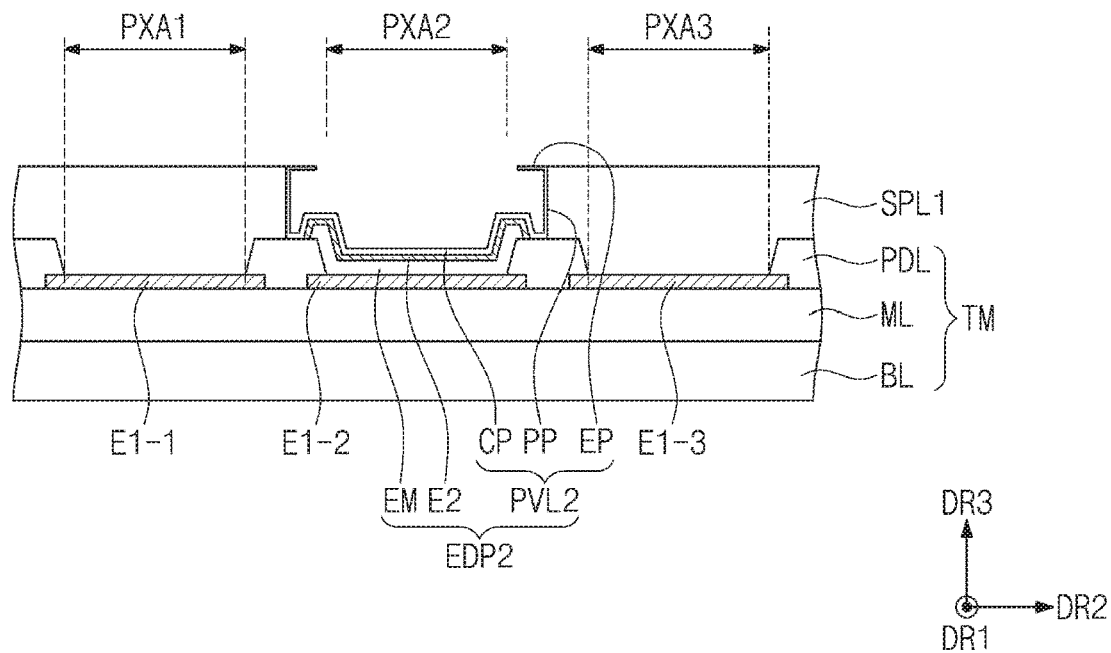
Figure 11I:
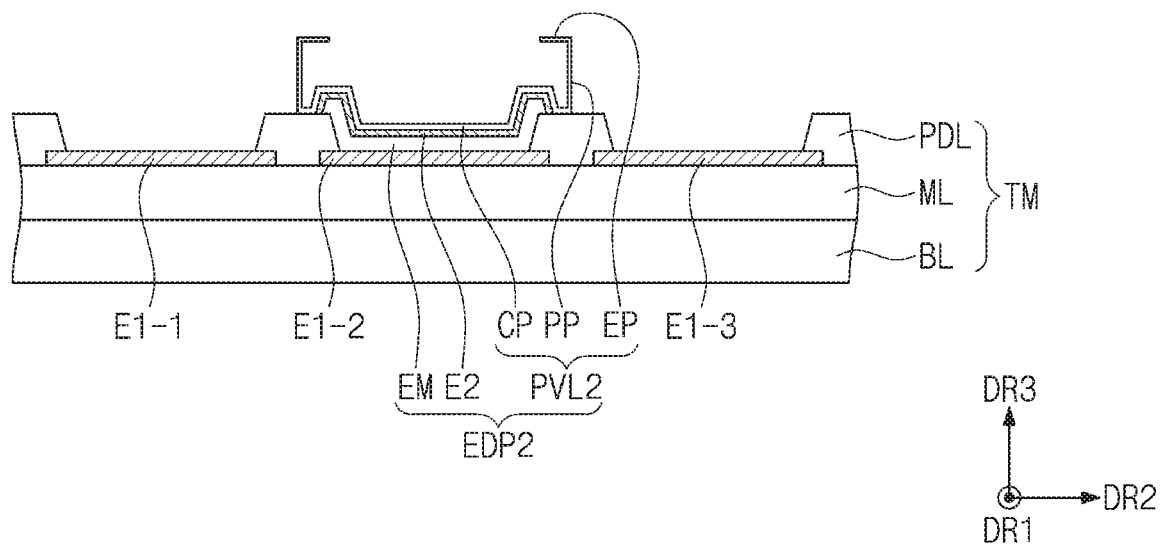

Thereafter, the second sub-pattern layer SPL2 and the second pattern layer SPTL2 are removed through a strip process. Then, as illustrated in FIG. 11H, the first sub-pattern layer SPL1 is exposed on the target material TM. The first sub-pattern layer SPL1 may be removed through a developing process or an etching process. Then, as illustrated in FIG. 11I, the pattern layers on the target material TM are removed, and only a light emitting element pattern EDP2 is remained.

The embodiment of the inventive concept may provide the process of forming the light emitting element pattern, which is capable of easily performing the lift-off process of the photoresist pattern and improving the performance of the protection layer when the protection layer for protecting the light emitting layer and the electrode layer are formed.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for forming a light emitting element pattern, the method comprising:
   forming a pattern layer having an opening on a target material;
   forming a light emitting element pattern on the target material in correspondence to the opening; and
   removing the pattern layer, wherein the pattern layer comprises:
- a first pattern layer disposed on the target material;
- a second pattern layer disposed on the first pattern layer; and
- a third pattern layer disposed on the second pattern layer, wherein the second pattern layer has an undercut portion recessed from edges of the third pattern layer to define an inner opening between the first and third pattern layers, wherein the removing the pattern layer comprises removing the first to third pattern layers after forming the light emitting element pattern, wherein the forming the light element pattern on the target material comprises:
- forming a light emitting layer covering the target material exposed through the opening and a dummy light emitting layer covering an upper surface of the pattern layer;
- forming an electrode layer covering the light emitting layer and a dummy electrode layer covering the dummy light emitting layer; and
- forming a protection layer covering the electrode layer and a sidewall of the first pattern layer disposed adjacent to the opening and a dummy protection layer covering the dummy electrode layer, and wherein the protection layer and the dummy protection layer are separated from each other by the inner opening.

2. The method of claim 1, wherein the forming of the pattern layer comprises:
- forming a first layer on the target material;
- forming a second layer on the first layer;
- forming a third layer on the second layer;
- forming the third pattern layer by patterning the third layer;
- forming the second pattern layer by patterning the second layer; and
- forming the first pattern layer by patterning the first layer.

3. The method of claim 2, wherein the forming of the third pattern layer comprises:
- exposing the third layer; and
- forming the third pattern layer having a first opening corresponding to the opening by developing an exposed portion of the third layer.

4. The method of claim 2, wherein the forming of the second pattern layer comprises forming the second pattern layer having the inner opening by etching the second layer using the third pattern layer as a mask.

5. The method of claim 4, wherein the second layer is etched using an isotropic etching method.

6. The method of claim 2, wherein the forming of the first pattern layer comprises etching the first layer using the third pattern layer as a mask.

7. The method of claim 6, wherein the first layer is etched using an anisotropic etching method.

8. The method of claim 1, wherein the forming of the pattern layer comprises:
- forming a first layer on the target material;
- forming a second layer on the first layer;
- forming a third layer on the second layer;
- forming the third pattern layer by patterning the third layer;
- forming a preliminary pattern layer by patterning the second layer;
- forming the first pattern layer by patterning the first layer; and
- forming the second pattern layer by etching the preliminary pattern layer.

9. The method of claim 8, wherein the forming of the third pattern layer comprises:
- exposing the third layer; and
- forming the third pattern layer having a first opening corresponding to the opening by developing an exposed portion of the third layer.

10. The method of claim 8, wherein the forming of the preliminary pattern layer comprises forming the preliminary pattern layer by etching the second layer using the third pattern layer as a mask.

11. The method of claim 10, wherein the second layer is etched using an anisotropic etching method.

12. The method of claim 8, wherein the forming of the first pattern layer comprises etching the first layer using the third pattern layer and the preliminary pattern layer as a mask.

13. The method of claim 12, wherein the first layer is etched using an anisotropic etching method.

14. The method of claim 8, wherein the second pattern layer in which the inner opening is provided is formed by etching the preliminary pattern layer using an isotropic etching method.

15. The method of claim 1, wherein the second pattern layer comprises a metallic material or an inorganic material.

16. The method of claim 15, wherein the second pattern layer has a thickness of several hundreds Å to several thousands Å.

17. The method of claim 1, wherein the target material comprises:
- a base layer; and
- a pixel defining pattern configured to define a pixel area on the base layer.

18. The method of claim 17, wherein the protection layer comprises an inorganic material.

* * * * *